(12) United States Patent
Narihiro

(10) Patent No.: US 6,605,397 B2
(45) Date of Patent: Aug. 12, 2003

(54) METHOD OF PREPARING PATTERN DATA TO BE USED FOR DIFFERENT EXPOSURE METHODS

(75) Inventor: Mitsuru Narihiro, Tokyo (JP)

(73) Assignee: NEC Corporation, Tokyo (JP)

( * ) Notice: Subject to any disclaimer, the term of this patent is extended or adjusted under 35 U.S.C. 154(b) by 37 days.

(21) Appl. No.: 09/863,317

(22) Filed: May 24, 2001

(65) Prior Publication Data

US 2002/0012859 A1 Jan. 31, 2002

(30) Foreign Application Priority Data

May 24, 2000 (JP) ........................................ 2000-152291

(51) Int. Cl.⁷ ............................... G03F 9/00; G03C 5/00
(52) U.S. Cl. ......................... 430/30; 430/296; 430/942
(58) Field of Search ............................. 430/30, 296, 942

(56) References Cited

U.S. PATENT DOCUMENTS 6,117,600 A * 9/2000 Nakasuji ..................... 430/30

FOREIGN PATENT DOCUMENTS

| JP | 11-204407 | * | 7/1999 |
| JP | 11-204422 | * | 7/1999 |
| JP | 2000-39699 | * | 2/2000 |
| JP | 2000-49067 | * | 2/2000 |
| JP | 2000-66370 | * | 3/2000 |

OTHER PUBLICATIONS

R. Jonckheere et al., *DUV intra–level mix–and–match lithography for random logic 0.25μm CMOS*, Microelectronic Engineering 27, pp. 231–234;. (1995).*

* cited by examiner

*Primary Examiner*—Christopher G. Young
(74) *Attorney, Agent, or Firm*—Foley & Lardner

(57) ABSTRACT

Pattern data are divided into light beam exposure pattern data and electron beam exposure pattern data free of any overlap margin. Overlap margins are given without size-reduction to the electron beam exposure pattern in order to avoid any disappearance of any parts of the fine pattern.

18 Claims, 30 Drawing Sheets

Design Pattern

Narrowing electron beam exposure pattern
And extraction of that pattern

Broadening electron beam exposure pattern

Electron beam exposure pattern free of overlap margin

After process P4

Final electron beam exposure pattern with overlap margin

Electron beam exposure pattern free of overlap margin

After process P4

Final electron beam exposure pattern with overlap margin

First type shape pattern

Second type shape pattern

◪ Electron beam exposure pattern

☐ Light beam exposure pattern

Dividing design pattern into electron beam pattern and light beam pattern

Forming overlap margin vertical to boundary line between
Electron beam exposure pattern and light beam pattern Forming electron beam exposure pattern with overlap margin Shifting overlap margin vertical to boundary line in −Y-direction by $\Delta Wy \perp$ Widening overlap margin vertical to boundary line by $\Delta Wy$ // AND-operation Shifting overlap margin parallel to boundary line in +Y-direction by $\Delta Wy \perp$ OR-operation

METHOD OF PREPARING PATTERN DATA TO BE USED FOR DIFFERENT EXPOSURE METHODS

BACKGROUND OF THE INVENTION

1. Field of the Invention

The present invention relates to a method of preparing pattern data for combined use of two different exposure methods to a single resist so called to as "intra-level mix & match", and more particularly to a method of avoiding any disconnection due to misalignments or displacements between the two different exposure methods.

2. Description of the Related Art

The combined use of two different exposure methods to a single resist is so called to as "intra-level mix & match", wherein the two different exposure methods may be an electron beam exposure and a light beam exposure. The electron beam exposure is superior in resolving power, whilst the light beam exposure is superior in throughput. The electron beam exposure is carried out for forming fine patterns or small size patterns with high resolving power. The electron beam exposure is then carried out for forming remaining patterns with high throughput.

It is necessary for the "intra-level mix & match" to provide an overlapping margin to at least one of two sets of the exposure pattern data for the light and electron beam exposures in consideration of an unavoidable displacement or misalignment of the exposure patterns. If no overlapping margin is provided to the two sets of the exposure pattern data, an unavoidable displacement or misalignment of the exposure patterns results in disconnection of the patterns.

A method of preparing exposure pattern data with any overlapping margin in the "intra-level mix & match" is disclosed in "Microelectronic Engineering" vol. 27, pp. 231–234, which was published in 1995 from ELSEVIER, and entitled "Electron beam/DUV intra-level mix-and-match lithography for random logic 0.25 μm CMOS" and reported by R. Jonckheere.

Fine patterns with a smaller size than 0.4 micrometers are formed by the electron beam exposure with the high resolving power and then the remaining patterns are formed by an KrF exposure with the high throughput. This "intra-level mix & match" lithography is applied to form gate electrodes of the CMOS devices. On boundary regions between the KrF exposure patterns and the electron beam exposure pattern, the KrF exposure pattern has an overlapping margin which overlaps the electron beam exposure pattern by 0.1 micrometer.

The conventional method is to provide the overlapping margin to the electron beam exposure with the high throughput and low resolving power, wherein the overlapping margin makes the actual pattern size different from the designed size. The overlapping margin reduces the alignment margin to a base.

Japanese laid-open patent publication No. 11-204407 discloses another intra-level mix-and-match lithography, wherein fine patterns with smaller sizes than 0.25 micrometers are formed by the electron beam exposure and then the remaining patterns are formed by the KrF exposure, provided that the overlapping margin is provided to the electron beam exposure with the high resolving power. The intra-level mix-and-match lithography processes will be described hereafter.

FIG. 1 is a flow chart illustrative of a conventional intra-level mix-and-match lithography, provided that the overlapping margin is provided to the electron beam exposure with the high resolving power.

The preparation of the electron beam exposure pattern data will be described. In a first process PI, larger patterns than a predetermined reference size "Lth" are extracted from pattern data D1 to prepare light pattern data D2 which will be converted to a reticule formation data for forming a reticule for the electron beam exposure.

The preparation of the electron beam exposure pattern data will subsequently be described. In a process P2, design pattern data D1 are modified to reduce pattern widths by $\Delta W1$ which is more than zero. In a process P3, a reference size is set to be $Lth-2\Delta W1$, so that smaller patterns than the reference size of $Lth-2\Delta W1$ are extracted to prepare electron beam exposure pattern bare data D3 which are free of any overlapping margin. In a process P4, the electron beam exposure pattern bare data D3 are modified to increase pattern widths by $\Delta W2$ which is more than zero, thereby preparing electron beam exposure pattern modified data D4 with overlapping margins. The electron beam exposure pattern modified data D4 are then converted into data for an electron beam writer.

FIGS. 2A through 2C are views of patterns in sequential processes for preparing electron beam exposure pattern data D4 with the overlapping margin. With reference to FIG. 2A, there are two different design patterns 1 and 2. The design pattern 1 has a minimum size L1 which is less than $2\Delta W1$. The design pattern 2 has a minimum size L2 which is more than $2\Delta W1$. The minimum sizes L1 and L2 are smaller than Lth which is the critical size for isolating the electron beam exposure pattern and the electron beam exposure pattern.

With reference to FIG. 2B, the design patterns 1 and 2 are modified to reduce the individual widths by $\Delta W1$. Slender stripe portions of the designed patterns 1 and 2 correspond to portions to be patterned by the electron beam exposure. Square shaped portions of the designed patterns 1 and 2 correspond to portions to be patterned by the light beam exposure. Since the minimum size L1 of the design pattern 1 is smaller than $2\Delta W1$, then the slender stripe portion of the designed pattern 1 disappears, whilst the square shaped portions of the designed pattern 1 remain with size reductions. The slender stripe portion 7 and the square shaped portions 5 and 6 of the designed pattern 2 remain with size reductions, wherein the reference size is set to be $Lth-2\Delta W1$. The slender stripe portion 7 is to be patterned by the electron beam exposure, whilst the square shaped portions 5 and 6 are to be patterned by the light beam exposure. The slender stripe portion 7 is free of any overlapping margin.

With reference to FIG. 2C, only the stripe portion 7 of the designed pattern 2 is increased in width by $\Delta W2$, to form an electron beam exposure pattern 8 having overlapping margins 9 and 10 with a size of $\Delta W1+\Delta W2$. If $\Delta W1=\Delta W2$, the size of the electron beam exposure pattern is not changed.

The electron beam exposure pattern data D4 with the overlapping margin are prepared from the designed pattern data D1. If the minimum size of the design pattern is not more than $2\Delta W1$, then the above conventional method is not applicable because at least the minimum size part of the pattern disappears. It is possible that $\Delta W1$ is so set that $2\Delta W1$ is not more than the critical size. In this case, however, the overlapping margin size is $\Delta W1+\Delta W2$, for which reasons it is difficult to obtain a sufficient overlapping margin. If $\Delta W1$ is size-reduced and $\Delta W2$ is size-increased, then it is possible to obtain a sufficient overlapping margin. In this case, however, the design size of the portion other than overlapping margin portion is changed.

In order to have solved the above problems, another countermeasure was proposed. FIG. 3 is a flow chart of another conventional exposure processes. This processes are disclosed in Japanese laid-open patent publication No. 11-204407. ΔW1 is size-reduced, provided that the minimum-size portion of the pattern is not disappeared even allowing the disadvantage in size-reduction of the overlapping margin. However, a short side of the electron beam exposure pattern data is shifted by ΔW3 in a process P5, in order to obtain the sufficient overlapping margin of ΔW1+ΔW2+ΔW3. This method can not be implemented by the CAD system because the CAD system is incapable of shifting only the short sides of all the patterns.

The electron beam exposure pattern data are variable in long-side length. It is, actually, however, difficult to replacing the electron beam exposure pattern data into the modified pattern data having the overlapping margins.

The above conventional method has a further disadvantage that the following problem is raised if the electron beam exposure pattern is in contact directly with the light beam exposure pattern. FIG. 4A is a view of electron beam exposure patterns adjacent to light beam exposure patterns in sequential processes shown in FIG. 3. The original electron beam exposure pattern 11 is free of the overlapping margin to the light beam exposure patterns 12 and 13. After the processes P2 through P4 are carried out, then the original electron beam exposure pattern 11 is changed to a modified electron beam exposure pattern 14 with overlapping margins of ΔW1+ΔW2. The final electron beam exposure pattern 15 has overlapping margins of ΔW1 +ΔW2+ΔW3.

FIG. 4B is a view of electron beam exposure patterns adjacent to light beam exposure patterns in sequential processes shown in FIG. 3. The original electron beam exposure pattern 16 is free of the overlapping margin. After the processes P2 through P4 are carried out, then the original electron beam exposure pattern 16 is changed to an electron beam exposure pattern 17 without overlapping margins. The final electron beam exposure pattern 18 has overlapping margins of ΔW3, even the final electron beam exposure pattern 18 does not need any overlapping margins since the electron beam exposure pattern 16 is not adjacent to the light beam exposure pattern. This means that the electron beam exposure pattern, which is not adjacent to the light beam exposure pattern, is changed in size.

FIG. 5 is a view of two different type patterns, for example, first and second type patterns. The first type pattern 19 comprises two square-shaped light beam exposure pattern portions and a single slender stripe shape electron beam exposure pattern portion which connects the two square-shaped light beam exposure pattern portions, wherein one long side of the electron beam exposure pattern portion is aligned to one side of each of the two square-shaped light beam exposure pattern portions.

The second type pattern 20 comprises two square-shaped light beam exposure pattern portions and a single slender stripe shape electron beam exposure pattern portion which connects the two square-shaped light beam exposure pattern portions, wherein the electron beam exposure pattern portion is aligned to centers of the two square-shaped light beam exposure pattern portions.

FIG. 6 is a view of a position-shifted electron beam exposure pattern adjacent to light beam exposure patterns. If the electron beam exposure pattern is shifted by a smaller distance than the short side length of the electron beam exposure pattern, then the electron beam exposure pattern still overleaps the light beam exposure patterns. If the electron beam exposure pattern is shifted by a larger distance than the short side length of the electron beam exposure pattern, then the electron beam exposure pattern does not overleap the light beam exposure patterns. Namely, the pattern is disconnected. This problem is more serious if the short side length of the electron beam exposure pattern is small.

Consequently, the above described prior arts have the following disadvantages.

The first disadvantage is that it is difficult to add the overlap margin to the fine pattern. In accordance with the conventional method, the pattern width is reduced by ΔW1 which is more than zero. If the pattern width is not more than 2ΔW1, then the pattern width at least partially disappears. The CAD system is not applicable to shift the electron beam exposure pattern parts of the patterns without changing the pattern size.

The second disadvantage is that if the pattern data include the above first type pattern and if the shifted distance is larger than the minimum size or the short side length of the electron beam exposure pattern, then the pattern is disconnected.

In the above circumstances, the development of a novel method of preparing pattern data free from the above problems is desirable.

SUMMARY OF THE INVENTION

Accordingly, it is an object of the present invention to provide a novel method of preparing pattern data free from the above problems.

It is a further object of the present invention to provide a novel method of preparing pattern data with adding overlap margins between different pattern parts to be patterned in the different exposure methods without any change in the pattern size.

It is a still further object of the present invention to provide a novel preparing pattern data with adding overlap margins between different pattern parts to be patterned in the different exposure methods without any disconnection of the pattern.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DETAILED DESCRIPTION OF THE PREFERRED EMBODIMENTS

Figure 1:
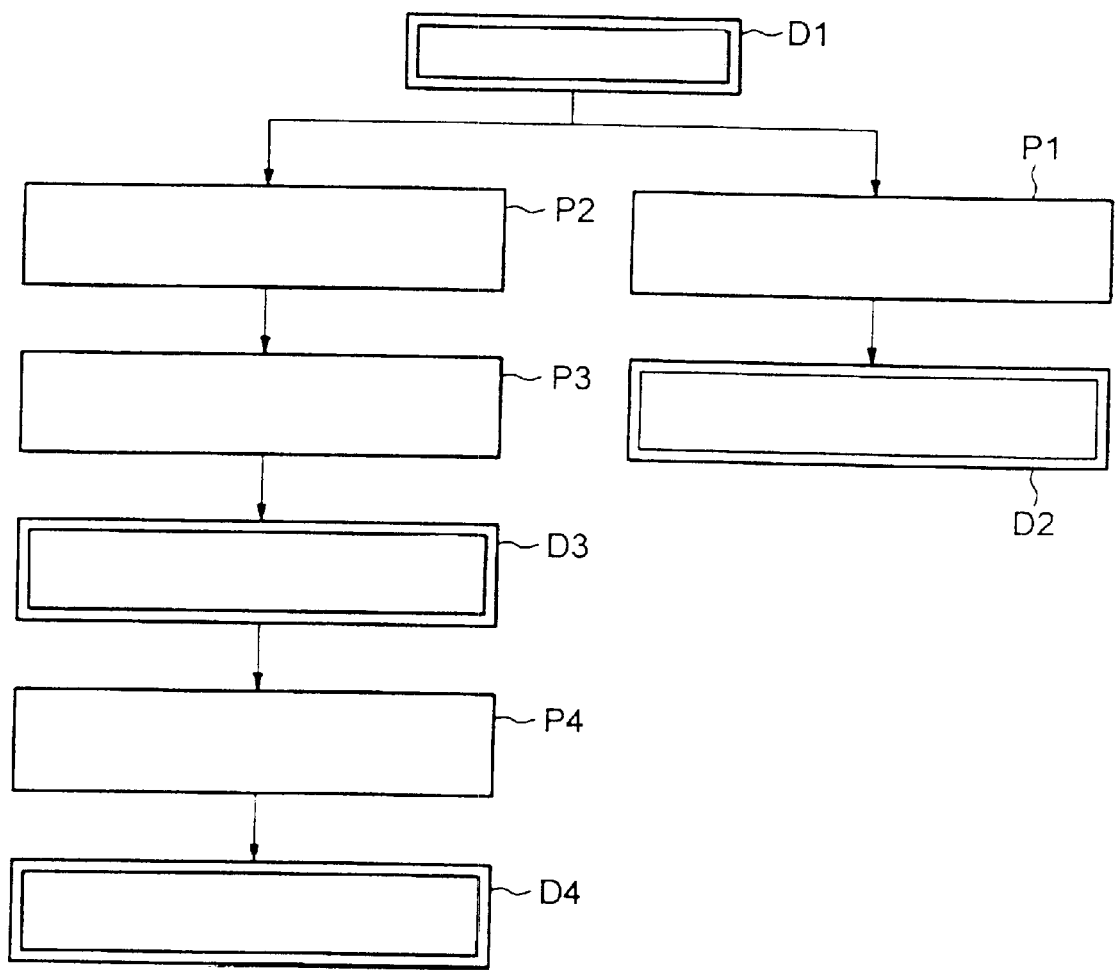
FIG. 1 is a flow chart illustrative of a conventional intra-level mix-and-match lithography, provided that the overlapping margin is provided to the electron beam exposure with the high resolving power.
Figure 2A:
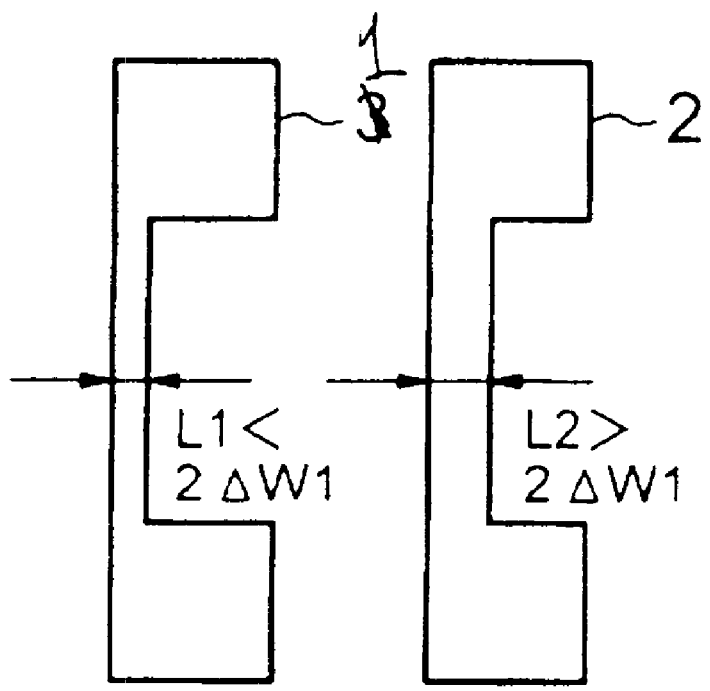
FIGS. 2A through 2C are views of patterns in sequential processes for preparing electron beam exposure pattern data D4 with the overlapping margin.
Figure 2B:
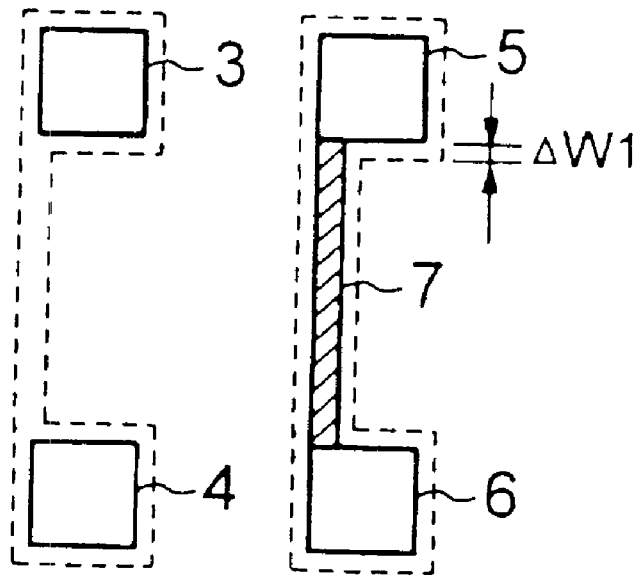
Figure 2C:
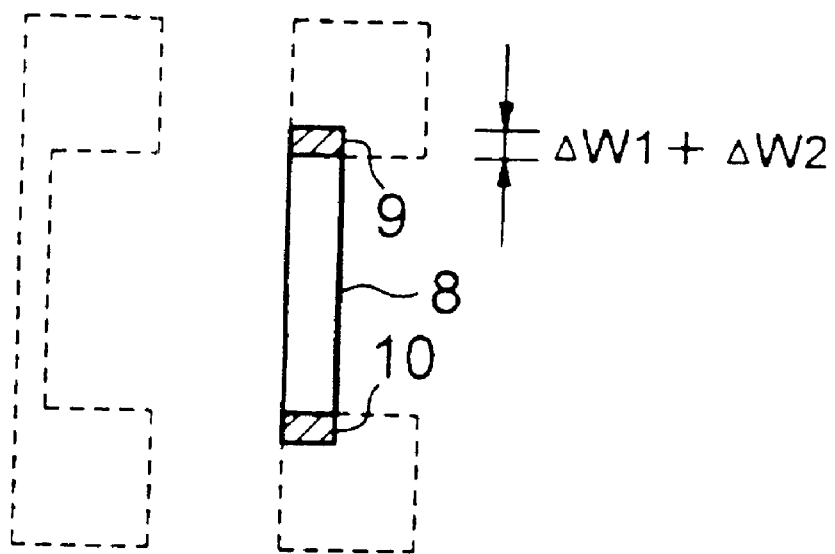
Figure 3:
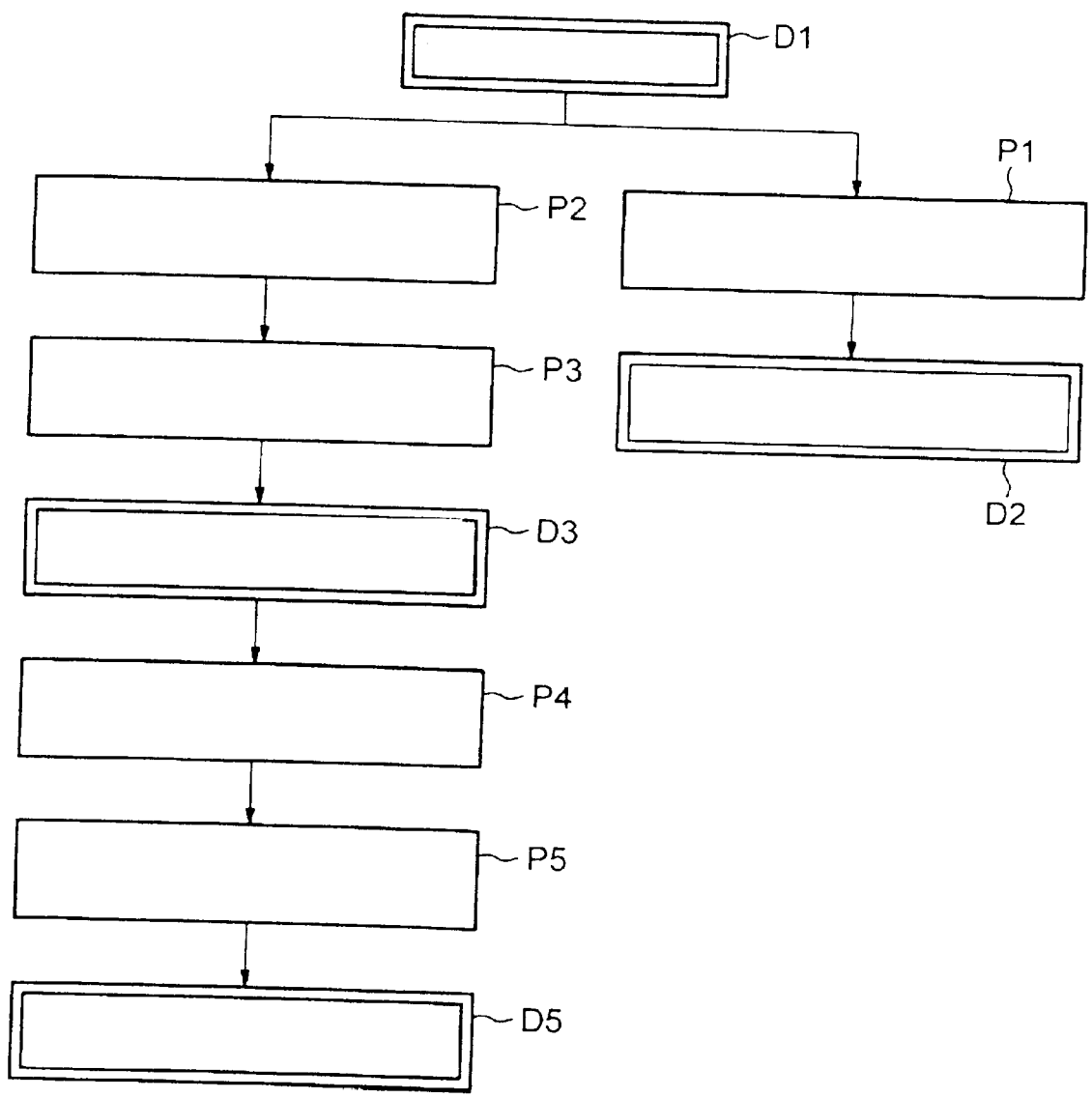
FIG. 3 is a flow chart of another conventional exposure processes.
Figure 4A:
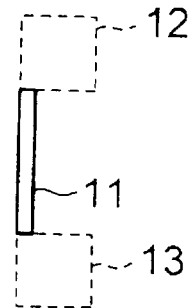
FIG. 4 is a view of electron beam exposure patterns in sequential processes shown in FIG. 3.
Figure 4A:
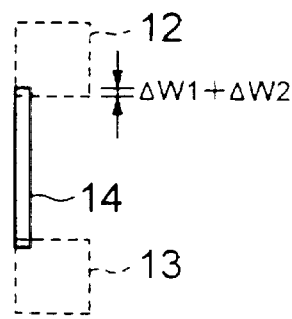
Figure 4A:
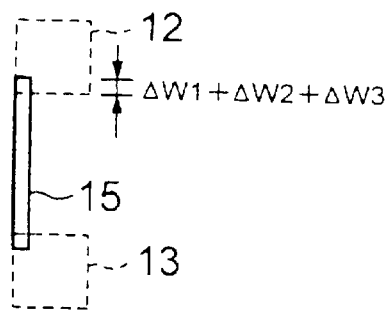
Figure 4B:
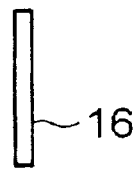
Figure 4B:
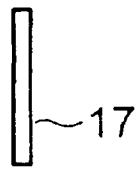
Figure 4B:
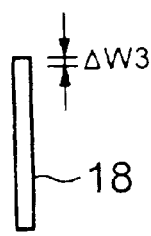
Figure 5:
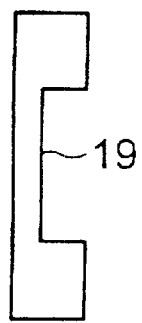
FIG. 5 is a view of two different type patterns, for example, first and second type patterns.
Figure 5:
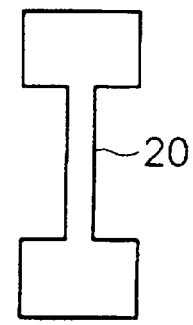
Figure 6:
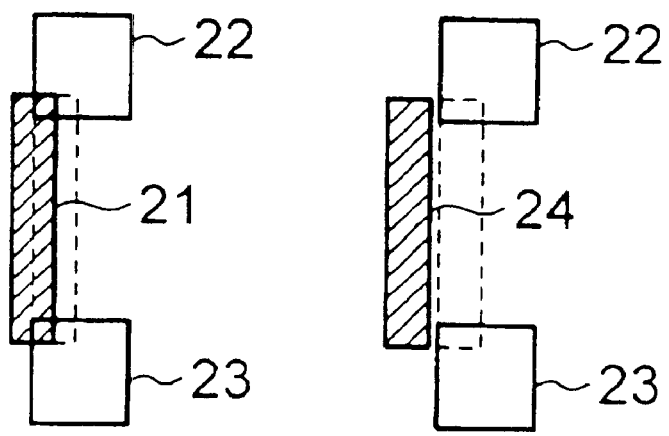
FIG. 6 is a view of a position-shifted electron beam exposure pattern adjacent to light beam exposure patterns.

A first aspect of the present invention is a method of preparing a pattern data for a first type exposure process with a first resolving power and a second type exposure process with a second resolving power, which is higher than the first resolving power. The method comprises the steps of: dividing the pattern data into a first type pattern data for the first type exposure process and a second type pattern data for the second type exposure process, wherein the second type pattern data is free of overlap margin; carrying out at least a relative displacement of the second type pattern data to the first type pattern data for forming at least an overlap margin between the first and second type pattern data; and combining the at least overlap margin to the second type pattern data.

It is possible to further comprises: an AND-operation between the first and second type pattern data to extract the overlap margin before the combining step.

It is further possible that the combining step comprises an OR-operation between the at least overlap margin and the second type pattern data.

It is further possible that the at least relative displacement is carried out in at least one of a first direction, a second direction anti-parallel to the first direction, a third direction perpendicular to the first direction and a fourth direction anti-parallel to the third direction.

It is furthermore possible that the first and second directions are perpendicular to a boundary line between the first and second type pattern data, and the third and fourth directions are parallel to the boundary line.

It is furthermore possible that the step of forming at least an overlap margin further comprises : forming a first type overlap margin which extends from the boundary line in a perpendicular direction to the boundary line; and forming a second type overlap margin which extends in a direction parallel to the boundary line.

It is moreover possible that the step of forming the second type overlap margin further comprises: shifting the first type overlap margin in one of the first and second directions; broadening an outline of the first type overlap margin for forming an additional overlap margin between the broadened first type overlap margin and the first type exposure pattern data; and shifting the additional overlap margin in one of the third and fourth directions for forming the second type overlap margin.

It is furthermore possible that the first type exposure process comprises a light beam exposure process, and the second type exposure process comprises an electron beam exposure process.

A second aspect of the present invention is a method of preparing a pattern data for a first type exposure process with a first resolving power and a second type exposure process with a second resolving power, which is higher than the first resolving power. The method comprises the steps of dividing the pattern data into a first type pattern data for the first type exposure process and a second type pattern data for the second type exposure process, wherein the second type pattern data is free of overlap margin; broadening an outline of the second type pattern data for forming at least an overlap margin between the first and second type pattern data and combining the at least overlap margin to the second type pattern data.

It is possible to further comprise: an AND-operation between the first and second type pattern data to extract the overlap margin before the combining step.

It is also possible that the combining step comprises an OR-operation between the at least overlap margin and the second type pattern data.

It is also possible that the step of broadening the outline is carried out in at least one pair of first and second directions anti-parallel to each other, and third and fourth directions anti-parallel to each other and perpendicular to the first and second directions.

It is further possible that the first and second directions are perpendicular to a boundary line between the first and second type pattern data, and the third and fourth directions are parallel to the boundary line.

It is also possible that the step of forming at least an overlap margin further comprises: forming a first type overlap margin which extends from the boundary line in a perpendicular direction to the boundary line; and forming a second type overlap margin which extends in a direction parallel to the boundary line.

It is also possible that the step of forming the second type overlap margin further comprises: shifting the first type overlap margin in one of the first and second directions;

broadening an outline of the first type overlap margin for forming an additional overlap margin between the broadened first type overlap margin and the first type exposure pattern data; and shifting the additional overlap margin in one of the third and fourth directions for forming the second type overlap margin.

It is also possible that the first type exposure process comprises a light beam exposure process, and the second type exposure process comprises an electron beam exposure process.

A third aspect of the present invention is a method of preparing a pattern data for a first type exposure process with a first resolving power and a second type exposure process with a second resolving power, which is higher than the first resolving power. The method comprises the steps of: dividing the pattern data into a first type pattern data for the first type exposure process and a second type pattern data for the second type exposure process, wherein the second type pattern data is free of overlap margin; forming a first type overlap margin which extends from he boundary line in a perpendicular direction to the boundary line; and forming a second type overlap margin which extends in a direction parallel to the boundary line; and combining the at least overlap margin to the second type pattern data.

It is also possible that the step of forming the second type overlap margin further comprises: shifting the first type overlap margin in one of the first and second directions; broadening an outline of the first type overlap margin for forming an additional overlap margin between the broadened first type overlap margin and the first type exposure pattern data; and shifting the additional overlap margin in one of the third and fourth directions for forming the second type overlap margin.

It is also possible to further comprise: an AND-operation between the first and second type pattern data to extract the overlap margin before the combining step.

It is also possible that the combining step comprises an OR-operation between the at least overlap margin and the second type pattern data.

It is also possible that the first type exposure process comprises a light beam exposure process, and the second type exposure process comprises an electron beam exposure process.

In accordance with the present invention, pattern data are divided into light beam exposure pattern data and electron beam exposure pattern data free of any overlap margin. Overlap margins are given without size-reduction to the electron beam exposure pattern in order to avoid any disappearance of any parts of the fine pattern.

Further, it is also possible that the electron beam exposure pattern is shifted from an original design position by a corresponding amount to an overlap margin to be formed, so as to form an overlapping margin between the shifted electron beam exposure pattern and the light beam exposure pattern. If the electron beam exposure pattern is not adjacent to the light beam exposure pattern, then no overlap margin is added to the electron beam exposure pattern and the electron beam exposure pattern remains unchanged in size.

Further more, it is also possible that the electron beam exposure pattern is increased in width from an original design width by a corresponding amount to an overlap margin to be formed, so as to form an overlapping margin between the width-increased electron beam exposure pattern and the light beam exposure pattern. If the electron beam exposure pattern is not adjacent to the light beam exposure pattern, then no overlap margin is added to the electron beam exposure pattern and the electron beam exposure pattern remains unchanged in size.

Moreover, the patterns include at least a first type pattern, which comprises at least two light beam exposure pattern portions and an electron beam exposure pattern portion which connects the two light beam exposure pattern portions, wherein one long side of the electron beam exposure pattern portion is aligned to one side of each of the two light beam exposure pattern portions. In this case, overlapping margins extend not only in a vertical direction to a boundary line between the electron beam exposure pattern and the light beam exposure pattern but also in a parallel direction to the boundary line, so that even if the electron beam exposure pattern is displaced in the parallel direction by the corresponding amount to the short side length of the electron beam exposure pattern, then the electron beam exposure pattern and the light beam exposure pattern are connected through the overlapping margin extending in the parallel direction for avoiding any disconnection of the pattern. The overlapping margin extending in the parallel direction to the boundary line is preferably minimum but essential for suppressing the drop of the throughput.

The present invention will be described in more detail with reference to the drawings. A first embodiment according to the present invention will be described in detail with reference to FIG. 7 which is a flow chart of sequential processes for preparing pattern data in a first embodiment in accordance with the present invention. The resist pattern is defined by first and second type exposure methods, wherein the first type exposure method is lower in resolving power and higher in throughput than the second type exposure method. The first type exposure method may, for example, be light beam exposure, and the second type exposure method may, for example, be electron beam exposure.

The processes comprises the following first to third processes P11, P12 and P13. The first process P11 is to divide design pattern data D1 into first type exposure pattern data D2 and second type exposure pattern data D4, wherein the second type exposure pattern data D4 are free of any overlap margin. The second process P12 is to form overlap margins D5, D6, D7 and D8 which extend in vertical directions to boundary lines between the first and second type exposure pattern data D2 and D4. The overlap margins D5, D6, D7 and D8 extend in +X-direction, −X-direction, +Y-direction, and −Y-direction namely in the four directions in two-dimensional space for carrying out equivalent operations to all directions.

The third process P13 is to add the overlap margins D5, D6, D7 and D8 to the second type exposure pattern data D4 to provide modified data D9.

Figure 7:
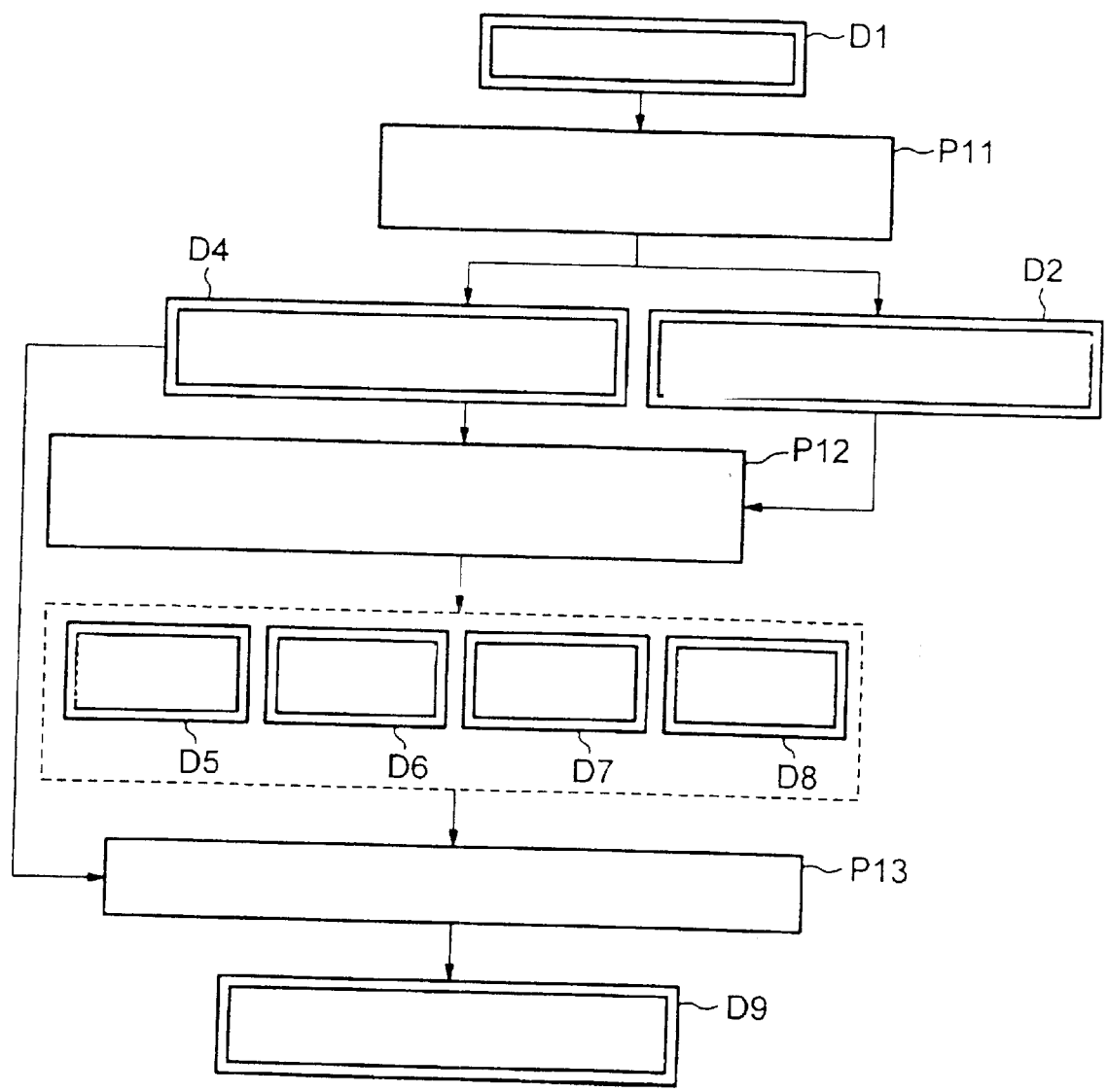
FIG. 7 is a flow chart of sequential processes for preparing pattern data in a first embodiment in accordance with the present invention.
Figure 8:
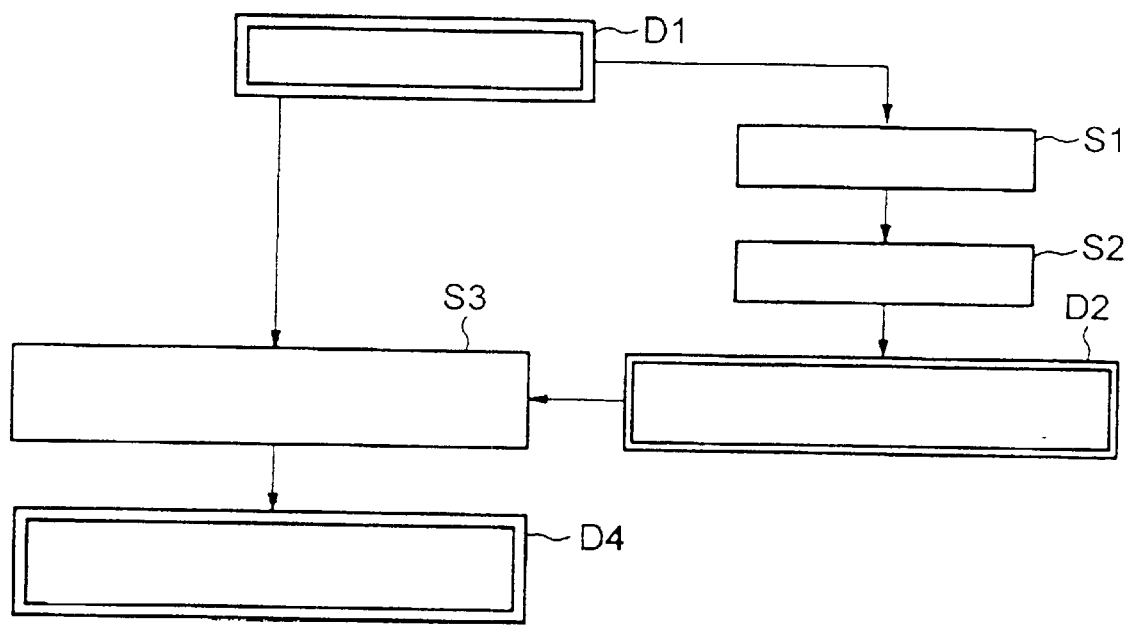
FIG. 8 is a flow chart of a first process P11 in FIG. 7.

The above first process P11 will be described in more detail with reference to FIG. 8 which is a flow chart of a first process P11 in FIG. 7. The first process P11 further includes the following three steps S1, S2 and S3.

In the first step S1, the design pattern data D1 are modified to reduce the pattern width by Lth/2, wherein Lth is a reference size for dividing the design pattern data D1 into first type exposure pattern data D2 and second type exposure pattern data D4, whereby outlines of the pattern are moved inside by Lth/2. Namely, the smaller pattern with a smaller size than Lth becomes disappeared.

In the second step S2, the modified pattern data, except for disappeared pattern data are then further-modified to increase the pattern width by Lth/2. Namely, the larger pattern with a larger size than Lth are once width-reduced by Lth/2 and then width-increased by Lth/2, wherein the pattern size is returned to the original size. The smaller pattern with a smaller size than Lth are once disparaged, for which reason the further-modification to increase the pattern width is not applied to the disparaged pattern. As a result, the larger pattern with a larger size than Lth are extracted from the original pattern data D1. The extracted larger pattern with a larger size than Lth are defined to be the first type exposure pattern D2.

In a third step S3, the first type exposure pattern D2 are subtracted from the original pattern data D1, whereby remainder pattern with a smaller size than Lth are defined to be the second type exposure pattern D4, wherein the second type exposure pattern D4 is free of any overlap margin.

Figure 9:
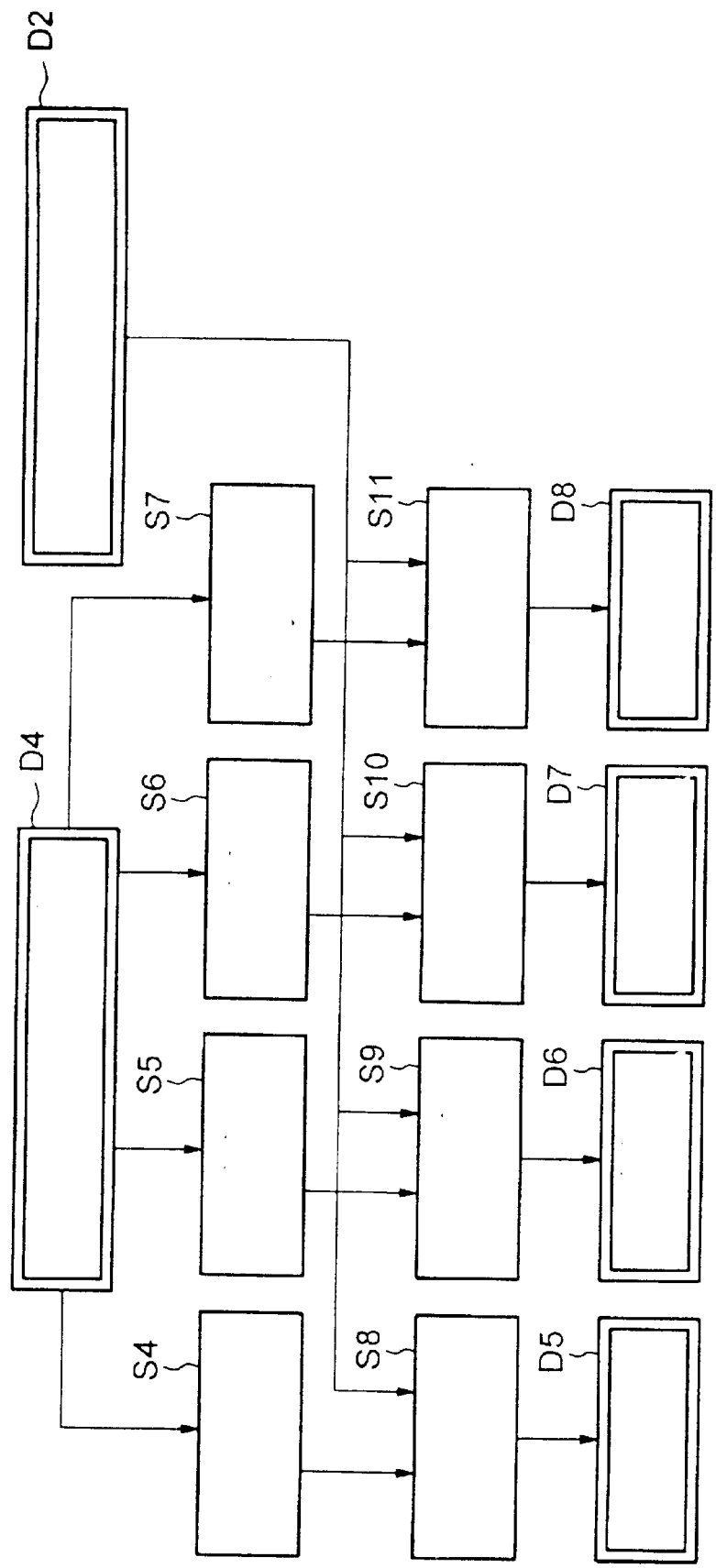
FIG. 9 is a flow chart of a second process P12 in FIG. 7.

The above second process P12 will be described in more detail with reference to FIG. 9 which is a flow chart of a second process P12 in FIG. 7. The second process P12 further includes the following eight steps S4, S5, S6, S7, S8, S9, S10 and S11. As described above, the second process P12 form the four overlap margins D5, D6, D7 and D8 which extend in the +X-direction, −X-direction, +Y-direction, and −Y-direction. The following descriptions will be made by taking an example of +Y-direction.

In a step S6, the second type pattern data D4 free of any overlap margin are shifted in the +Y-direction by $\Delta Wy\perp$, which is more than zero. $\Delta Wy\perp$ corresponds to a size of the overlap margin extending in the vertical direction of the boundary line which extends in the Y-direction.

In a step S10, an AND-operation is made between the first and second type exposure pattern data D2 and D4 to extract an overlap margin between the first and second type exposure pattern data D2 and D4. The extracted overlap margin is defined to be a +Y-directional overlap margin $\perp D7$. If some of the second type exposure patterns are not adjacent to the first type exposure patterns, then no overlap margin is provided to this second type exposure pattern which is not adjacent to the first type exposure pattern. The second type exposure patterns are free from any size-change.

As to the −Y-direction, in the step S7, the second type pattern data D4 free of any overlap margin are shifted in the −Y-direction opposite to the +Y-direction by the $\Delta Wy\perp$.

In a step S11, an AND-operation is made between the first and second type exposure pattern data D2 and D4 to extract an overlap margin between the first and second type exposure pattern data D2 and D4. The extracted overlap margin is defined to be a −Y-directional overlap margin $\perp D8$. If some of the second type exposure patterns are not adjacent to the first type exposure patterns, then no overlap margin is provided to this second type exposure pattern which is not adjacent to the first type exposure pattern. The second type exposure patterns are free from any size-change.

As to the +X-direction, in the step S4, the second type pattern data D4 free of any overlap margin are shifted in the +X-direction by $\Delta Wx\perp$, which is more than zero. $\Delta Wx\perp$ corresponds to a size of the overlap margin extending in the vertical direction of the boundary line which extends in the X-direction.

In a step S8, an AND-operation is made between the first and second type exposure pattern data D2 and D4 to extract an overlap margin between the first and second type exposure pattern data D2 and D4. The extracted overlap margin is defined to be a +X-directional overlap margin $\perp D5$. If some of the second type exposure patterns are not adjacent to the first type exposure patterns, then no overlap margin is provided to this second type exposure pattern which is not adjacent to the first type exposure pattern. The second type exposure patterns are free from any size-change.

As to the −X-direction, in the step S5, the second type pattern data D4 free of any overlap margin are shifted in the −X-direction opposite to the +X-direction by $\Delta Wx\perp$.

In a step S9, an AND-operation is made between the first and second type exposure pattern data D2 and D4 to extract an overlap margin between the first and second type exposure pattern data D2 and D4. The extracted overlap margin is defined to be a −X-directional overlap margin $\perp D6$. If some of the second type exposure patterns are not adjacent to the first type exposure patterns, then no overlap margin is provided to this second type exposure pattern which is not adjacent to the first type exposure pattern. The second type exposure patterns are free from any size-change.

The third process P13 is carried out by OR-operation of the second type exposure pattern data D4 and the corresponding overlap margins $\perp D5$, $\perp D6$, $\perp D7$, and $\perp D8$. Namely, the second type exposure pattern data are processed by OR-operation with no overlap margin.

It is, of course, possible to omit the processes for overlap margins in the unnecessary directions if this has been known previously.

The novel method of the first embodiment is applicable to all cases, except when the patterns includes at least a pattern which comprises at least two first type exposure pattern portions and the second type exposure pattern portion which connects the two first type exposure pattern portions, wherein one long side of the second type exposure pattern portion is aligned to one side of each of the two first type exposure pattern portions, provided that the shifting amount is not less than the short side length of the second type exposure pattern.

Figure 10A:
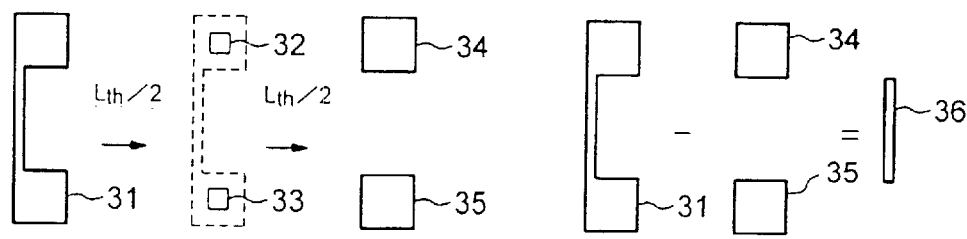
FIG. 10A is view of gate electrode patterns in sequential steps in the first process of FIG. 7.
Figure 10B:
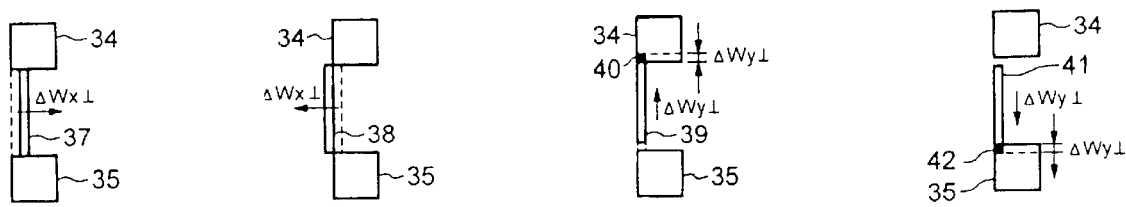
FIG. 10B is view of gate electrode patterns in sequential steps in the second process of FIG. 7.
Figure 10C:
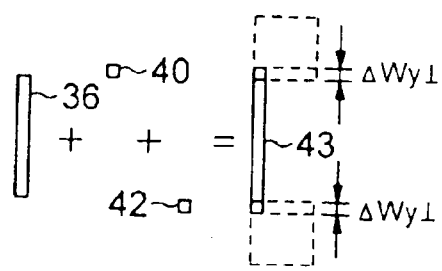
FIG. 10C is view of gate electrode patterns in sequential steps in the third process of FIG. 7.

The above novel method is applied to form gate electrode patterns in semiconductor integrated circuit. FIG. 10A is view of gate electrode patterns in sequential steps in the first process of FIG. 7. FIG. 10B is view of gate electrode patterns in sequential steps in the second process of FIG. 7. FIG. 10C is view of gate electrode patterns in sequential steps in the third process of FIG. 7.

With reference to FIG. 10A, a design pattern 31, comprising light beam exposure pattern portions and an electron beam exposure pattern portion, is modified to reduce a pattern width by Lth/2, whereby outlines of the pattern are moved inside by Lth/2. Namely, the electron beam exposure pattern portion becomes disappeared, and light beam exposure pattern portions 32 and 33 remain.

The modified pattern, for example, the light beam exposure pattern portions 32 and 33 are then further-modified to increase the pattern size by Lth/2, whereby light beam exposure pattern portions 34 and 35 are obtained.

The light beam exposure pattern portions 34 and 35 are subtracted from the original pattern data D1, whereby a remainder pattern is the electron beam exposure pattern 36, wherein the electron beam exposure pattern 36 is free of any overlap margin.

With reference to FIG. 10B, the electron beam exposure pattern 36 free of any overlap margin is sifted by $\Delta Wx\perp$ in +X-direction, whilst the light beam exposure patterns 34 and 35 remain, whereby a modified electron beam exposure pattern 37 is obtained. An AND operation is made between the modified electron beam exposure pattern 37 and the light beam exposure patterns 34 and 35. As a result, no overlap margin is formed.

The electron beam exposure pattern 36 free of any overlap margin is sifted by $\Delta Wx\perp$ in −X-direction, whilst the light beam exposure patterns 34 and 35 remain, whereby a modified electron beam exposure pattern 38 is obtained. An AND operation is made between the modified electron beam exposure pattern 38 and the light beam exposure patterns 34 and 35. As a result, no overlap margin is formed.

The electron beam exposure pattern. 36 free of any overlap margin is sifted by $\Delta Wy\perp$ in +Y-direction, whilst the light beam exposure patterns 34 and 35 remain, whereby a modified electron beam exposure pattern 39 is obtained. An AND operation is made between the modified electron beam exposure pattern 39 and the light beam exposure patterns 34 and 35. As a result, an overlap margin 40 is formed between the modified electron beam exposure pattern 39 and the light beam exposure pattern 34.

The electron beam exposure pattern 36 free of any overlap margin is sifted by $\Delta Wy\perp$ in −Y-direction, whilst the light beam exposure patterns 34 and 35 remain, whereby a modified electron beam exposure pattern 41 is obtained. An AND operation is made between the modified electron beam exposure pattern 41 and the light beam exposure patterns 34 and 35. As a result, an overlap margin 42 is formed between the modified electron beam exposure pattern 41 and the light beam exposure pattern 35.

With reference to FIG. 10C, an OR-operation of the electron beam exposure pattern 36 and the overlap margins 40 and 42 is made to form a final electron beam exposure pattern 43 with overlap margins of a size $\Delta Wy\perp$ with the light beam exposure patterns 34 and 35.

In accordance with the present invention, pattern data are divided into light beam exposure pattern data and electron beam exposure pattern data free of any overlap margin. Overlap margins are given to the electron beam exposure pattern data without size-reduction to the electron beam exposure pattern in order to avoid any disappearance of any parts of the fine pattern.

Figure 11:
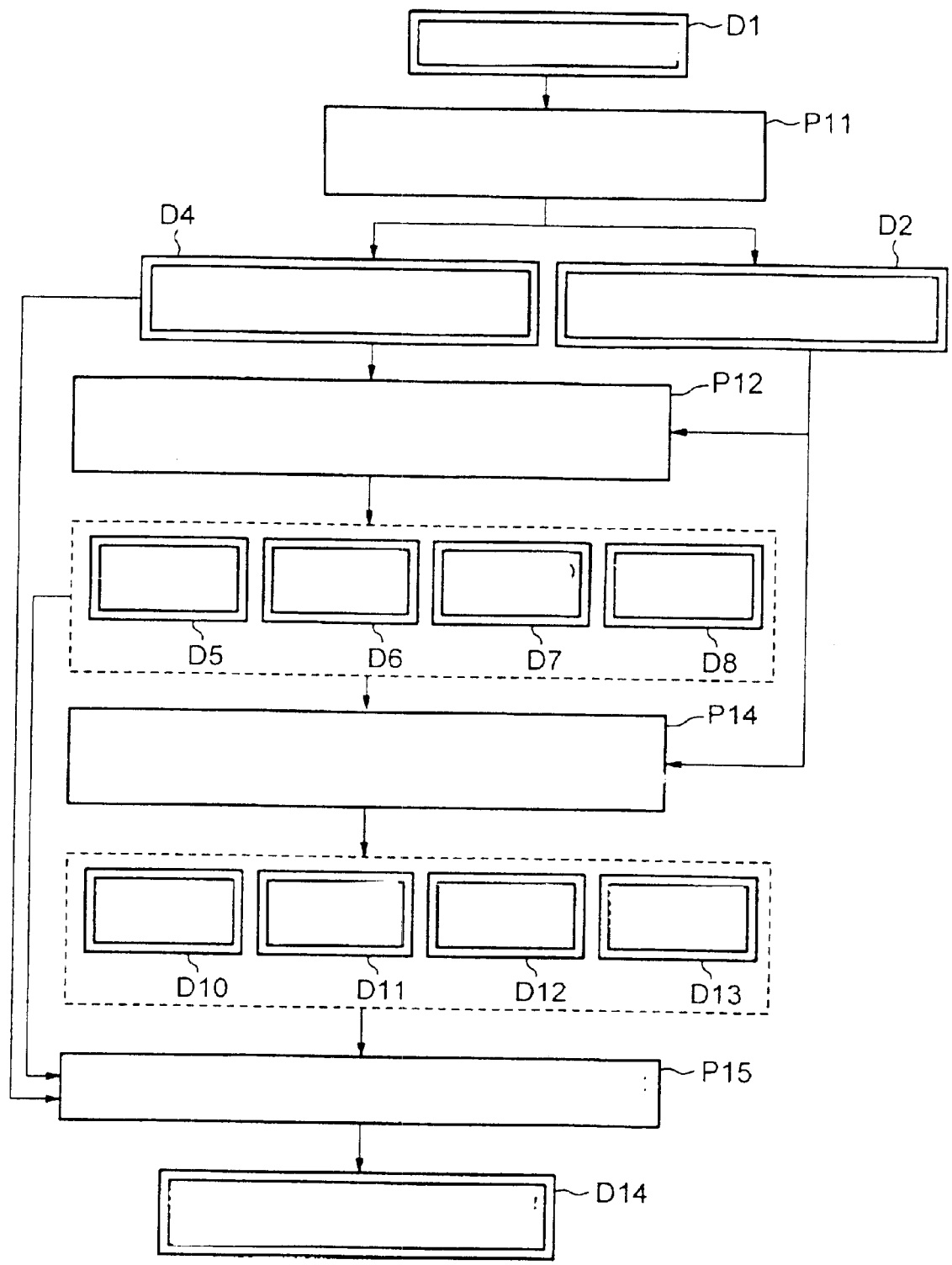
FIG. 11 is a flow chart of sequential processes for preparing pattern data in a second embodiment in accordance with the present invention.

A second embodiment according to the present invention will be described in detail with reference to FIG. 11 which is a flow chart of sequential processes for preparing pattern data in a second embodiment in accordance with the present invention. The resist pattern is defined by first and second type exposure methods, wherein the first type exposure method is lower in resolving power and higher in throughput than the second type exposure method. The first type exposure method may, for example, be light beam exposure, and the second type exposure method may, for example, be electron beam exposure.

The processes comprises the following first to fourth processes P11, P12, P14 and P15. The first process P11 is to divide design pattern data D1 into first type exposure pattern data D2 and second type exposure pattern data D4, wherein the second type exposure pattern data D4 are free of any overlap margin. The second process P12 is to form overlap margins D5, D6, D7 and D8 which extend in vertical directions to boundary lines between the first and second type exposure pattern data D2 and D4. The overlap margins D5, D6, D7 and D8 extend in +X-direction, −X-direction, +Y-direction, and −Y-direction namely in the four directions in two-dimensional space for carrying out equivalent operations to all directions.

The fourth process P14 is to form overlap margins D10, D11, D12 and D13 which extend in parallel directions to boundary lines between the first and second type exposure pattern data D2 and D4. The overlap margins D10, D11, D12 and D13 extend in +X-direction, −X-direction, +Y-direction, and −Y-direction namely in the four directions in two-dimensional space for carrying out equivalent operations to all directions.

In the third process P14, overlap margins D10, D11, D12 and D13, which extend in the +X-direction, −X-direction, +Y-direction, and −Y-direction, are prepared from the overlap margins D5, D6, D7 and D8 prepared in the second process P12.

Figure 12:
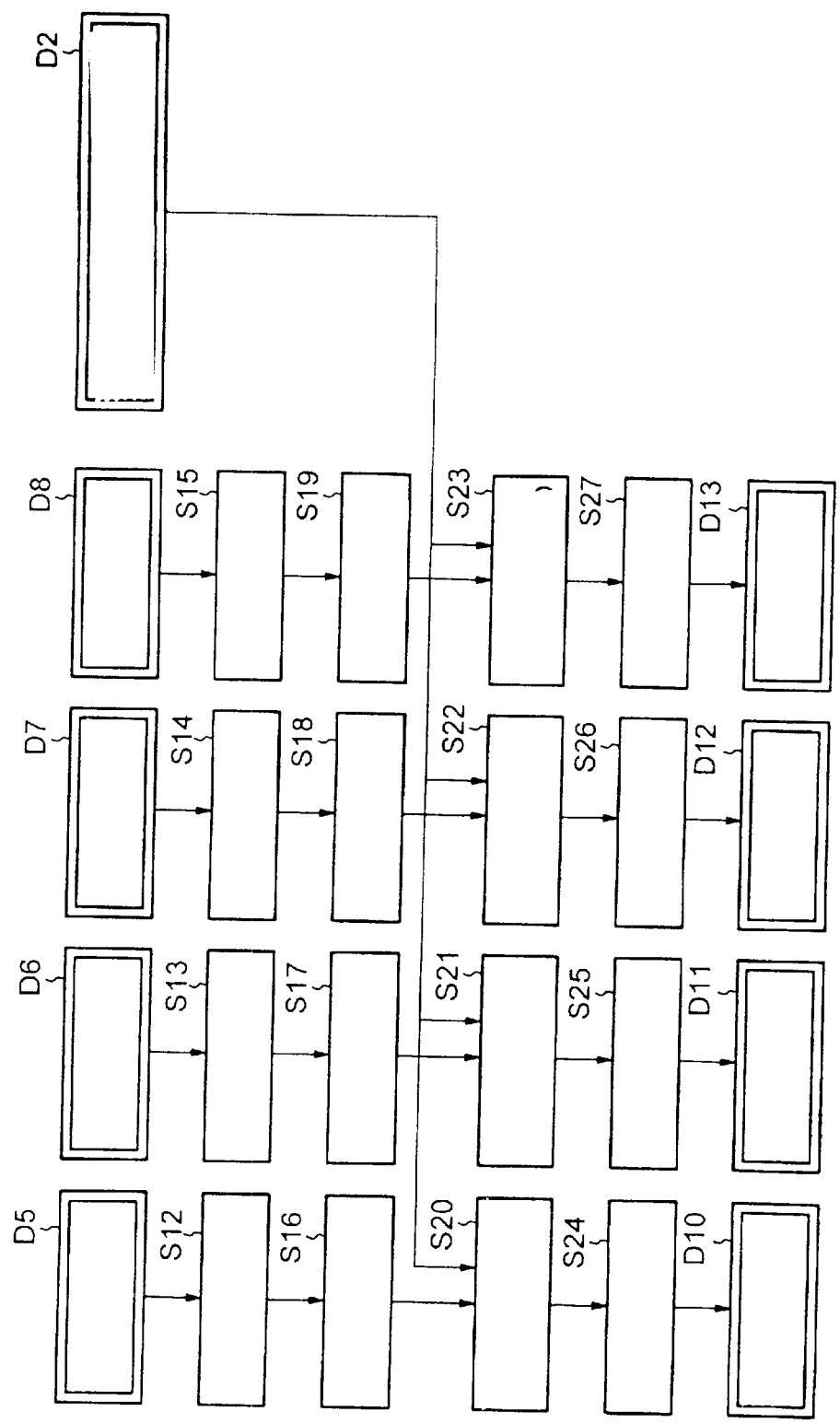
FIG. 12 is a flow chart of a third process P14 in FIG. 11.

The above third process P14 will be described in more detail with reference to FIG. 12 which is a flow chart of a third process P14 in FIG. 11. The third process P14 further includes the following steps. The following descriptions will be made by taking an example of +Y-direction.

In a step S14, the +Y-directional overlap margin $\perp$D7 is shifted in the −Y-direction by $\Delta Wy\perp$, which is more than zero. As a result, the +Y-directional overlap margin $\perp$D7 is positioned at an end position of the second type exposure pattern data D4 free of overlap margin, whereby no overlap margin is present between the first type and second type exposure pattern data D2 and D4.

In a step S18, the pattern obtained in the step S14 is further modified to increase the width by $\Delta Wy//$ which is more than zero. The $\Delta Wy//$ corresponds to a size of the overlap margin extending in the parallel direction of the boundary line which extends in the Y-direction.

In a step S22, an AND-operation is made between the first and second type exposure pattern data to extract an overlap margin between the first and second type exposure pattern data. The extracted overlap margin is in parallel to the boundary line. This extracted overlap margin overlaps with the +Y-directional overlap margin $\perp$D7 formed in the previous process P13.

In a step S26, the extracted overlap margin is shifted in the +Y-direction by by $\Delta Wy$ to form a +Y-directional overlap margin //D112.

As to the −Y-direction, in a step S15, the −Y-directional overlap margin $\perp$D8 is shifted in the +Y-direction by $\Delta Wy\perp$, which is more than zero. As a result, the +Y-directional overlap margin $\perp$D8 is positioned at an end position of the second type exposure pattern data D4 free of overlap margin, whereby no overlap margin is present between the first type and second type exposure pattern data D2 and D4.

In a step S19, the pattern obtained in the step S14 is further modified to increase the width by $\Delta Wy//$.

In a step S23, an AND-operation is made between the first and second type exposure pattern data to extract an overlap margin between the first and second type exposure pattern data. The extracted overlap margin is in parallel to the boundary line. This extracted overlap margin overlaps with the +Y-directional overlap margin $\perp$D8 formed in the previous process P13.

In a step S27, the extracted overlap margin is shifted in the −Y-direction by by $\Delta Wy$ to form a −Y-directional overlap margin //D13.

As to the +X-direction, in the step S12, the +Y-directional overlap margin $\perp$D5 is shifted in the −X-direction by $\Delta Wx\perp$, which is more than zero. As a result, the +X-directional overlap margin $\perp$D5 is positioned at an end position of the second type exposure pattern data D4 free of overlap margin, whereby no overlap margin is present between the first type and second type exposure pattern data D2 and D4.

In a step S16, the pattern obtained in the step S12 is further modified to increase the width by $\Delta Wx//$ which is more than zero. The $\Delta Wx//$ corresponds to a size of the overlap margin extending in the parallel direction of the boundary line which extends in the X-direction.

In a step S20, an AND-operation is made between the first and second type exposure pattern data to extract an overlap margin between the first and second type exposure pattern data. The extracted overlap margin is in parallel to the boundary line. This extracted overlap margin overlaps with the +X-directional overlap margin ⊥D5 formed in the previous process P13.

In a step S24, the extracted overlap margin is shifted in the +X-direction by by ΔWx to form a +X-directional overlap margin //D10.

As to the −X-direction, in the step S13, the −Y-directional overlap margin ⊥D6 is shifted in the +X-direction by ΔWx⊥. As a result, the −X-directional overlap margin ⊥D6 is positioned at an end position of the second type exposure pattern data D4 free of overlap margin, whereby no overlap margin is present between the first type and second type exposure pattern data D2 and D4.

In a step S17, the pattern obtained in the step S13 is further modified to increase the width by ΔWx//. The ΔWx//corresponds to a size of the overlap margin extending in the parallel direction of the boundary line which extends in the X-direction.

In a step S21, an AND-operation is made between the first and second type exposure pattern data to extract an overlap margin between the first and second type exposure pattern data. The extracted overlap margin is in parallel to the boundary line. This extracted overlap margin overlaps with the −X-directional overlap margin ⊥D6 formed in the previous process P13.

In a step S25, the extracted overlap margin is shifted in the −X-direction by by ΔWx to form a −X-directional overlap margin //D11.

The fourth process P15 is carried out by OR-operation of the second type exposure pattern data D4 and the corresponding overlap margins ⊥D5, ⊥D6, ⊥D7, and ⊥D8, and the corresponding overlap margins //D10, //D11, //D12, and //D13. Namely, the second type exposure pattern data are processed by OR-operation with no overlap margin.

It is, of course, possible to omit the processes for overlap margins in the unnecessary directions if this has been known previously.

The novel method of the first embodiment is applicable to all cases, even when the patterns includes at least a pattern which comprises at least two first type exposure pattern portions and the second type exposure pattern portion which connects the two first type exposure pattern portions, wherein one long side of the second type exposure pattern portion is aligned to one side of each of the two first type exposure pattern portions, provided that the shifting amount is not less than the short side length of the second type exposure pattern.

If the exposure pattern is used for forming an electrically conductive pattern, such as a gate electrode pattern, it is preferable that the overlap margins parallel to the boundary line have sizes ΔWx// and ΔWy// which are larger than a short side length L of the second type exposure pattern data D4. If the first type and second type exposure pattern portions are connected to each other through overlap margins which are parallel to the boundary lines between the first type and second type exposure pattern portions and if the sizes ΔWx// and ΔWy// are smaller than the short side length L of the second type exposure pattern data D4 free of any overlap margin, then the resistance of the electrically conductive pattern depends on the overlap margin, whereby the required design performance is not satisfied.

Figure 13A:
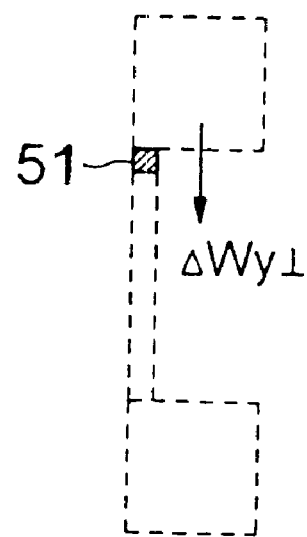
FIGS. 13A through 13C are views of gate electrode patterns in sequential steps in the third process P14 of FIG. 11.
Figure 13B:
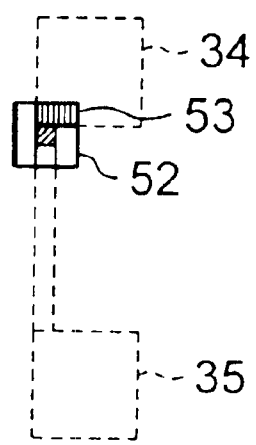
Figure 13C:
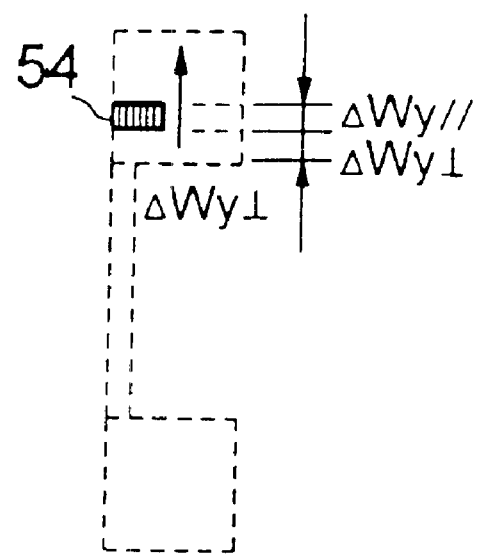
Figure 14:
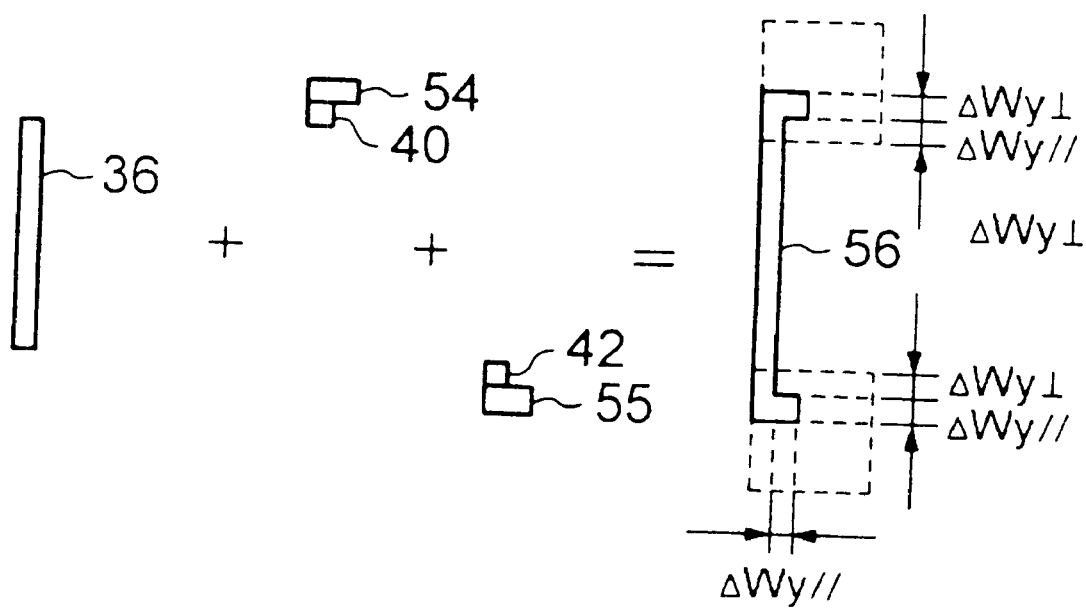
FIG. 14 is view of gate electrode patterns in sequential steps in he fourth process P15 of FIG. 1.

The above novel method is applied to form gate electrode patterns in semiconductor integrated circuit. FIGS. 13A through 13C are views of gate electrode patterns in sequential steps in the third process P14 of FIG. 11. FIG. 14 is view of gate electrode patterns in sequential steps in the fourth process P15 of FIG. 11.

With reference to FIG. 13A, in the step S14, the +Y-directional overlap margin ⊥40 is shifted by ΔWy⊥ in −Y-direction to obtain a pattern 51.

With reference to FIG. 13B, in the step S18, the pattern 51 is size-increased by ΔWy// to obtain a pattern 52. An AND operation is made between the pattern 52 and the light beam exposure pattern 34 to obtain a pattern 53.

With reference to FIG. 13C, the pattern 53 is shifted by ΔWy⊥ in +Y-direction to obtain a pattern 54 which is parallel to the boundary line.

With reference to FIG. 14, in a step S15, the electron beam exposure pattern 36 is added with the overlap margins 40, 50, 42 and 55 to 15 obtain a final electron beam exposure pattern 56 with overlap margins, wherein the third processes P14 form the +Y-directional overlap margin ⊥40, the +Y-directional overlap margin //54, −Y-directional overlap margin ⊥42, and the −Y-directional overlap margin //55.

Figure 15A:
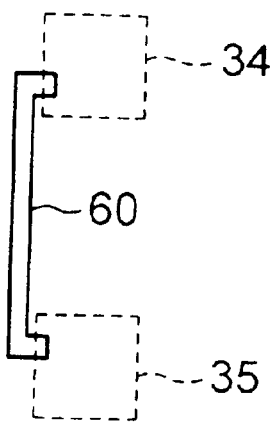
FIG. 15A is a view of a final electron beam exposure pattern displaced relative to light beam exposure patterns.

FIG. 15A is a view of a final electron beam exposure pattern displaced relative to light beam exposure patterns. If the final electron beam exposure pattern 56 is displaced in the X-direction by a smaller amount of L+ΔWy//, then the displaced electron beam exposure pattern 60 is still connected to the light beam exposure patterns. No disconnection is caused.

Figure 15B:
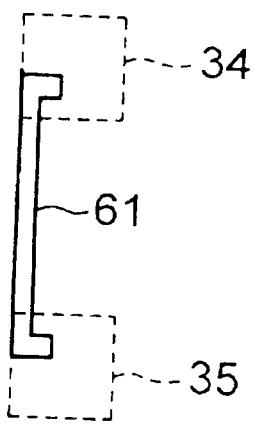
FIG. 15B is a view of another final electron beam exposure pattern displaced relative to light beam exposure patterns.

FIG. 15B is a view of another final electron beam exposure pattern displaced relative to light beam exposure patterns. If the final electron beam exposure pattern 56 is displaced in the Y-direction by a smaller amount of L+ΔWy⊥, then the displaced electron beam exposure pattern 61 is still connected to the light beam exposure patterns. No disconnection is caused.

A third embodiment according to the present invention will be described in detail with reference to FIG. 16 which is a flow chart of sequential processes for preparing pattern data in a third embodiment in accordance with the present invention. The resist pattern is defined by first and second type exposure methods, wherein the first type exposure method is lower in resolving power and higher in throughput than the second type exposure method. The first type exposure method may, for example, be light beam exposure, and the second type exposure method may, for example, be electron beam exposure.

The processes comprises the following first to fifth processes P11, P12, P16, P17 and P18. The first process P11 is to divide design pattern data D1 into first type exposure pattern data D2 and second type exposure pattern data D4, wherein the second type exposure pattern data D4 are free of any overlap margin. The second process P12 is to form overlap margins D5, D6, D7 and D8 which extend in vertical directions to boundary lines between the first and second type exposure pattern data D2 and D4. The overlap margins D5, D6, D7 and D8 extend in +X-direction, −X-direction, +Y-direction, and −Y-direction namely in the four directions in two-dimensional space for carrying out equivalent operations to all directions. The third process 16 is to select the overlap margins which are vertical to the boundary lines between the first type exposure pattern data and the second type exposure pattern data free of overlap margins. The fourth process P17 is to form overlap margins D19, D20, D21 and D22 which extend in parallel directions to boundary lines between the first and second type exposure pattern data. The overlap margins D19, D20, D21 and D22 extend in +X-direction, −X-direction, +Y-direction, and −Y-direction namely in the four directions in two-dimensional space for carrying out equivalent operations to all directions. The fifth process P18 is to carry out an OR-operation between the second type exposure pattern data free of the overlap margin and the overlap margins in four directions.

The sequential processes of this third embodiment are the same as the second embodiment except for the process P16.

In the third process P16, from +X-directional overlap margin ⊥D15, −X-directional overlap margin ⊥D16, +Y-directional overlap margin ⊥D17, and −Y-directional overlap margin ⊥D18, which are vertical to the boundary lines, are extracted from +X-directional overlap margin ⊥D5, −X-directional overlap margin ⊥D6, +Y-Directional overlap margin ⊥D7, and −Y-directional overlap margin ⊥D8. The process P17 is different from the process P14 in the above second embodiment but only in the input data.

The above process P16 will be described in more detail with reference to FIG. 17 which is a flow chart of a third process P16 in FIG. 16. The process P16 further includes the following nine steps for each of the four directions, for example, +X-direction, −X-direction, +Y-direction, and −Y-direction. The following descriptions will be made by taking an example of +Y-direction.

In a step S46, the +Y-directional overlap margin ⊥D17 is shifted in the −X-direction by L, which is the short side length of the second type exposure pattern data D4.

In a step S50, an AND-operation is made between the pattern formed by the step S46 and the first type exposure pattern data D2. If the AND-operation form a pattern, then any further overlap margin parallel to the boundary line is not necessary for the above overlap margin vertical to the boundary line, because even if a relative displacement in the −X-direction is caused, no disconnection appears between the first type exposure pattern data D2 and the second type exposure pattern data D4 free of any overlap margin.

For the relative displacement by L in the −X-direction, unnecessary overlap margin vertical to the boundary line is removed by the following steps.

In a step S54, the pattern formed by the step S50 is shifted by L in the +X-direction.

In a step S58, the pattern formed by the step S54 is subtracted from the +Y-directional overlap margin ⊥D17. If the problem with the above first type shape pattern is caused by the relative displacement by L in the −X-direction, the overlap margin vertical to the boundary line is not disappeared because no pattern is formed in the step S50. In the above steps, it has been verified that the +Y-directional overlap margin ⊥D17 vertical to the boundary line is sufficient for the relative relationship by L in the −X-direction.

Next, it will be verified that the +Y-directional overlap margin ⊥D17 vertical to the boundary line is sufficient for the relative relationship by L in the +X-direction. Substantially equivalent steps S47, S51, S55 and S59 to the above steps are carried out, wherein the direction of shifting the overlap margins is opposite.

Finally, the pattern formed by the step S58 and the pattern formed by the step S59 are combined to select related-patterns to the first type shape pattern from the +Y-directional overlap margin ⊥D17 vertical to the boundary line. The selected pattern is defined to be +Y-directional overlap margin ⊥D21.

The −Y-directional overlap margin ⊥D21 obtained by substantially the same operations as the +Y-directional overlap margin ⊥D17. The +X-directional overlap margin ⊥D15 the −X-directional overlap margin ⊥D16 are substantially similar operations as the +Y-directional overlap margin ⊥D17 and the −Y-directional overlap margin ⊥D21, except that the overlap margin is shifted in the Y-direction.

If the overlap margin vertical to the boundary line in one direction is unnecessary for the second type exposure pattern data free of any overlap margin has been previously known, or if no overlap margin vertical to the boundary line in one direction after the step S12, the operations in this direction may be omitted since any overlap margin vertical to the boundary line is absent.

This selecting method or selecting process may be applied to all cases that all of the second type exposure pattern data D4 free of the overlap margin have the uniform short side length L. If the second type exposure pattern data D4 free of the overlap margin have various short side lengths, then this method of this third embodiment is not directly applicable. In this case, after the process P11 for dividing the design pattern data D1 into the first type exposure pattern data D2 and the second type exposure pattern data D4 free of the overlap margin, then the second type exposure pattern data D4 free of the overlap margin is further divided into subordinate sets of the second type exposure pattern data D4 in view of the individual short side length, wherein the second type exposure pattern data D4 belonging to the same subordinate set have the same short side length. For each of the subordinate sets, the following processes to the process P11 are then carried out in the same manners as described above.

As described above, the overlap margin parallel to the boundary line is not added to the patterns except for the first type shape pattern, in order to suppress drop of the throughput of the second type exposure process.

If the exposure pattern is used for forming an electrically conductive pattern, such as a gate electrode pattern, it is preferable that the overlap margins parallel to the boundary line have sizes $\Delta Wx//$ and $\Delta Wy//$ which are larger than a short side length L of the second type exposure pattern data D4. If the first type and second type exposure pattern portions are connected to each other through overlap margins which are parallel to the boundary lines between the first type and second type exposure pattern portions and if the sizes $\Delta Wx//$ and $\Delta Wy//$ are smaller than the short side length L of the second type exposure pattern data D4 free of any overlap margin, then the resistance of the electrically conductive pattern depends on the overlap margin, whereby the required design performance is not satisfied.

Figure 18:
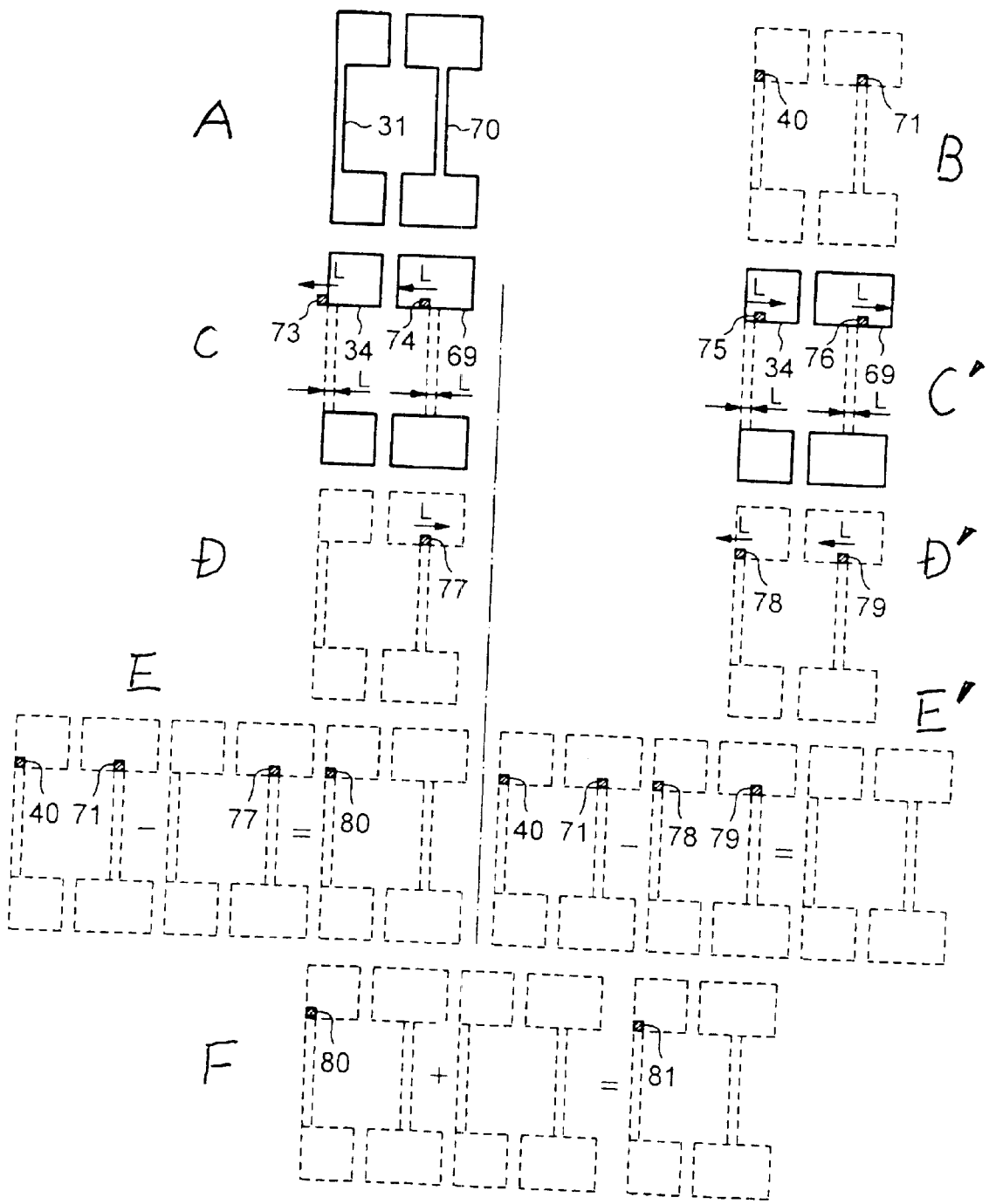
FIGS. 18A, 18B, 18C, 18C', 18D, 18D', 18E, 18E' and 18F are views of gate electrode patterns in sequential steps in the process P16 of FIG. 16.
Figure 19:
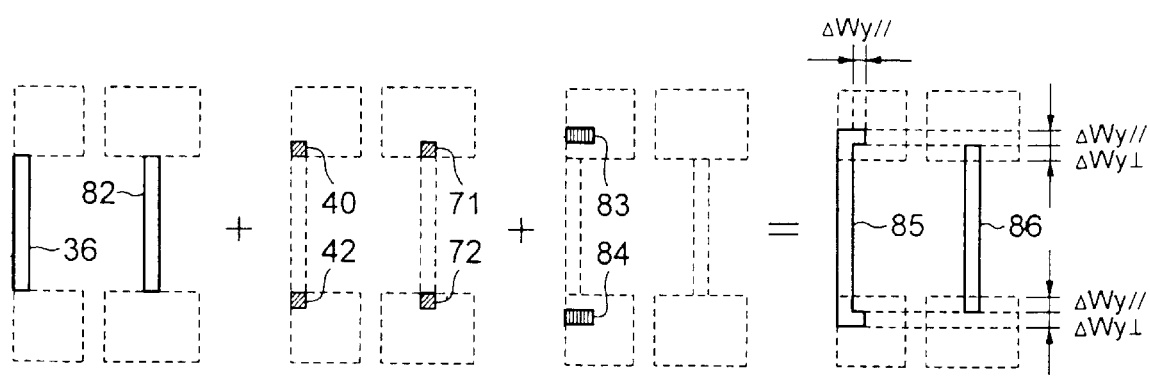
FIG. 19 is view of gate electrode patterns in sequential steps in the process P18 of FIG. 16.

The above novel method is applied to form gate electrode patterns in semiconductor integrated circuit. FIGS. 18A, 18B, 18C, 18C', 18D, 18D', 18E, 18E' and 18F are views of gate electrode patterns in sequential steps in the process P16 of FIG. 16. FIG. 19 is view of gate electrode patterns in sequential steps in the process P18 of FIG. 16.

With reference to FIG. 18A, a first type shape pattern 31 comprises two square-shaped light beam exposure pattern portions and a single slender stripe shape electron beam exposure pattern portion which connects the two square-shaped light beam exposure pattern portions, wherein one long side of the electron beam exposure pattern portion is aligned to one side of each of the two square-shaped light beam exposure pattern portions. A second type shape pattern 70 comprises two square-shaped light beam exposure pattern portions and a single slender stripe shape electron beam exposure pattern portion which connects the two square-shaped light beam exposure pattern portions, wherein the electron beam exposure pattern portion is aligned to centers of the two square-shaped light beam exposure pattern portions.

Figure 16:
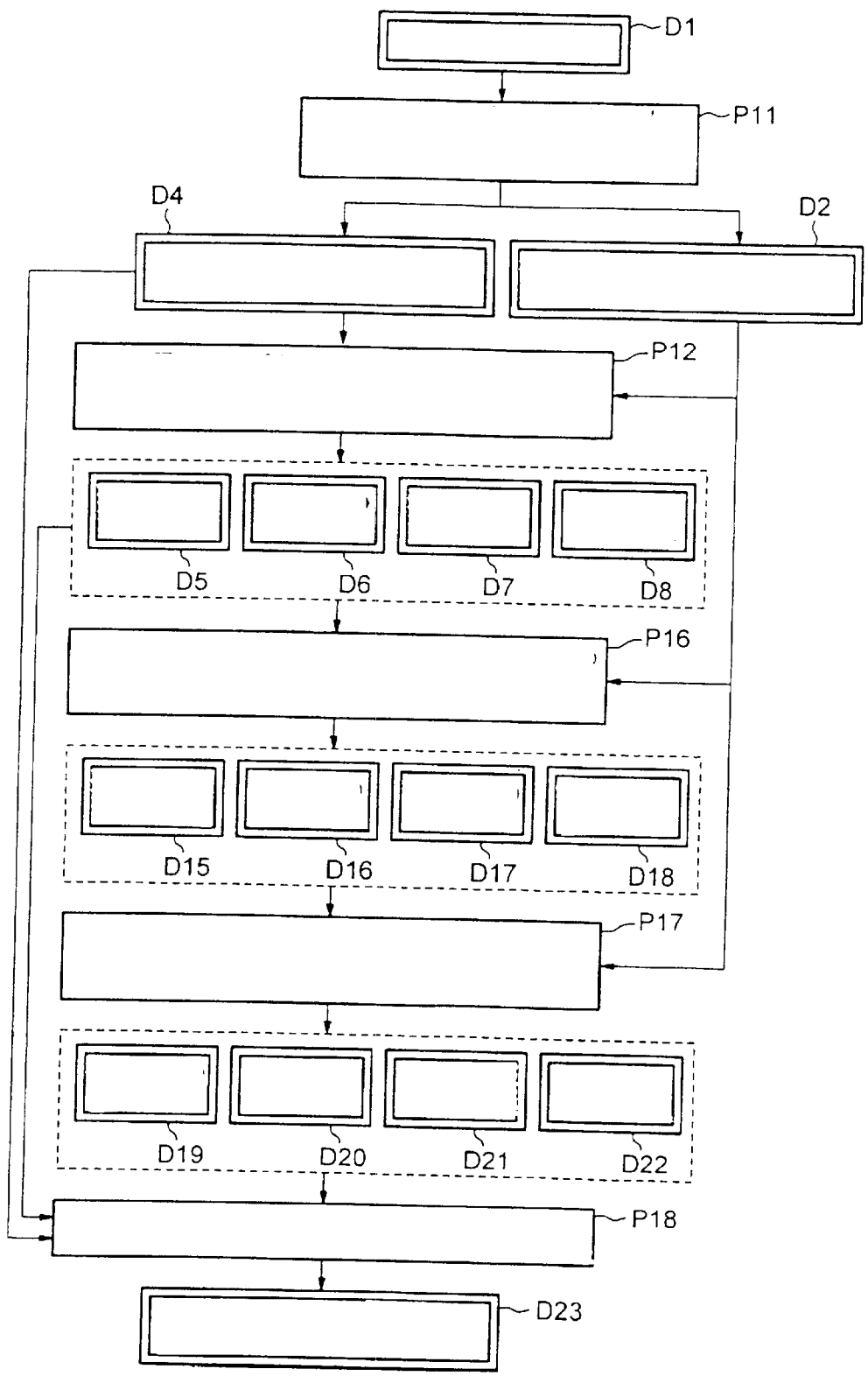
FIG. 16 is a flow chart of sequential processes for preparing pattern data in a third embodiment in accordance with the present invention.
Figure 17:
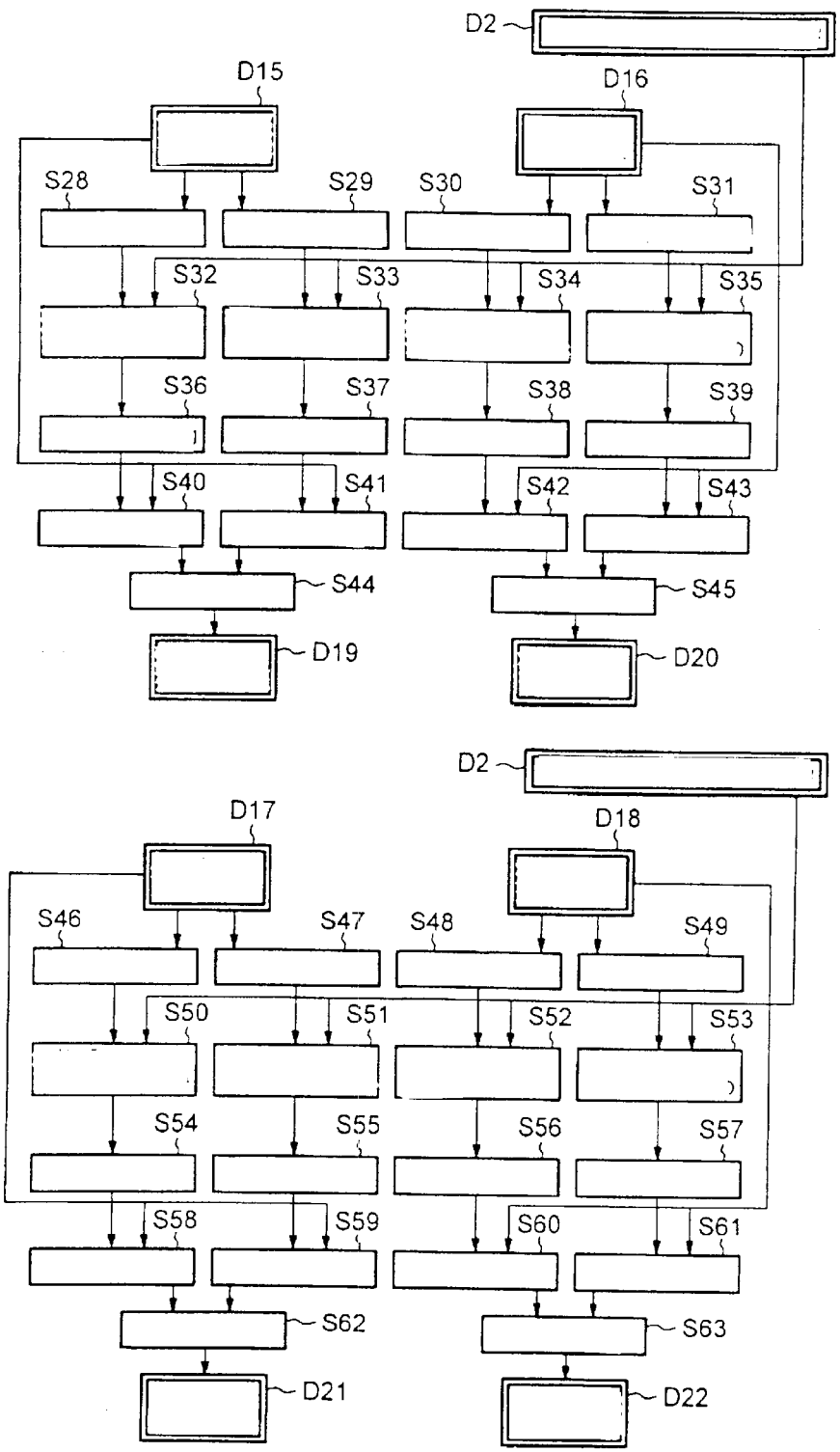
FIG. 17 is a flow chart of a third process P16 in FIG. 16.

With reference to FIG. 18B, the process P12 in FIG. 16 is carried out for the patterns 31 and 70, whereby +Y-directional overlap margins ⊥40 and ⊥71 are formed.

With reference to FIG. 18C, in a step S46, the +Y-directional overlap margins ⊥40 and ⊥71 are shifted by L in −X-direction to obtain patterns 73 and 74. In a step S50, an AND-operation is made between the patterns 73 and 74 and the light beam exposure patterns 34 and 69.

If the AND-operation is made between the pattern 73 and the light beam exposure pattern 34, no pattern is then formed. If, however, the AND-operation is made between the pattern 69 and the light beam exposure pattern 34, a pattern is then formed. In case of the first type shape pattern 31, if the overlap margin parallel to the boundary line is absent and if a relative displacement by L in the −X-direction is caused, then a disconnection of the pattern is caused. In case of the second type shape pattern 70, if the overlap margin parallel to the boundary line is absent and if a relative displacement by L in the −X-direction is caused, then no disconnection of the pattern is caused.

With reference to FIG. 18D, in a step S54, the pattern formed in the step S50 is shifted by L in the +X-direction to obtain a pattern 77. For the first type shape pattern 31, no pattern is formed by the step S50, then no pattern is thus formed by the step S54.

With reference to FIG. 18E, the pattern 77 obtained by the step S54 is subtracted from the +Y-directional overlap margins ⊥40 and ⊥71, thereby obtaining a pattern 80, which is an overlap margin vertical to the boundary line, wherein the pattern 80 should be added with further overlap margin parallel to the boundary line for avoiding the disconnection even if a relative displacement by L in the −X-direction is caused.

With reference to FIG. 18C', in a step S47, the +Y-directional overlap margins ⊥40 and ⊥71 are shifted by L in +X-direction to obtain patterns 75 and 76. In a step S51, an AND-operation is made between the patterns 75 and 76 and the light beam exposure patterns 34 and 69.

The patterns are formed not only to the second type shape pattern but also the first type shape pattern. This means that if the relative displacement by L in the +X-direction is caused, then the overlap margin parallel to the boundary line is not effective to avoid the disconnection.

With reference to FIG. 18D', in a step S55, the pattern formed in the step S51 is shifted by L in the −X-direction to obtain patterns 78 and 79.

With reference to FIG. 18E', the patterns 78 and 79 obtained by the step S55 are subtracted from the +Y-directional overlap margins ⊥40 and ⊥71, thereby obtaining no pattern. This means that if the relative displacement by L in the +X-direction is caused, then the overlap margin parallel to the boundary line is not necessary.

With reference to FIG. 18F, in a step S62, an OR-operation is made between the pattern 80 formed by the step S58 and no pattern formed by the step S59, thereby obtaining a pattern 81. The overlap margin ⊥80 necessary for a relative displacement by L in the −X-direction and no overlap margin necessary for a relative displacement by L in the +X-direction are combined to obtain the overlap margin ⊥ which is vertical to the boundary line and necessary for the relative displacement by L in the X-direction.

In the Y-direction, the same or equivalent processes are carried out to the above processes for the X-direction.

Further, the process P17 is carried out to obtain overlap margins 83 and 84 but only to the first type shape pattern.

Finally, with reference to FIG. 19, in the process P17, the electron beam exposure patterns 36 and 82 free of the overlap margin are combined with the overlap margins 40, 42, 71 and 72 vertical to the boundary line and also with the overlap margins 83 and 84, to obtain electron beam exposure patterns 85 and 86 having the overlap margins.

Figure 20:
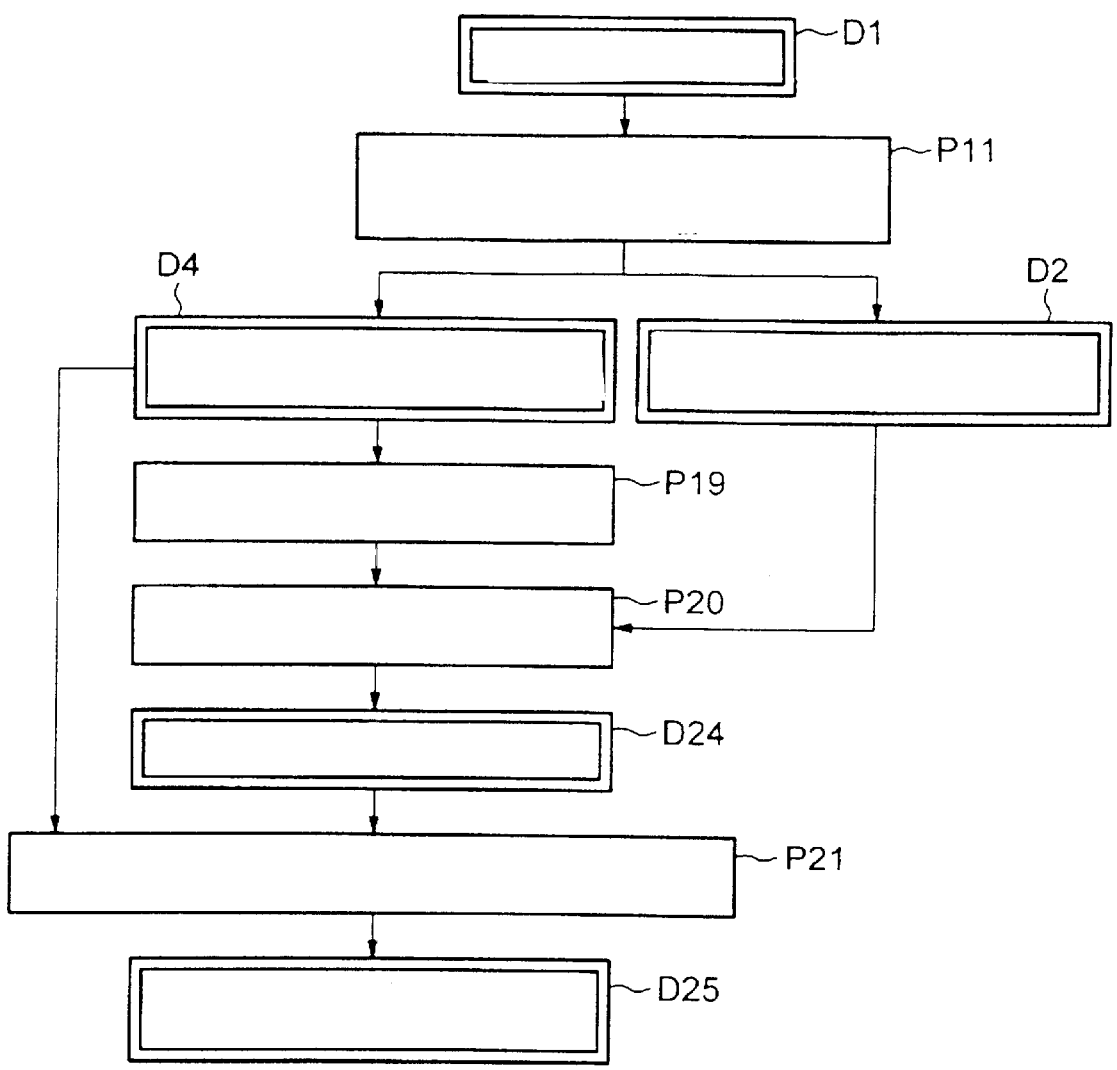
FIG. 20 is a flow chart of sequential processes for preparing pattern data in a fourth embodiment in accordance with the present invention.

A fourth embodiment according to the present invention will be described in detail with reference to FIG. 20 which is a flow chart of sequential processes for preparing pattern data in a fourth embodiment in accordance with the present invention. The resist pattern is defined by first and second type exposure methods, wherein the first type exposure method is lower in resolving power and higher in throughput than the second type exposure method. The first type exposure method may, for example, be light beam exposure, and the second type exposure method may, for example, be electron beam exposure.

The processes comprises the following first to fourth processes P11, P12, P16, P17 and P18. The first process P11 is to divide design pattern data D1 into first type exposure pattern data D2 and second type exposure pattern data D4, wherein the second type exposure pattern data D4 are free of any overlap margin. The second process P19 is to increase the size or the width of the second type exposure pattern data D4 by ΔW which is more than zero. The third process P20 is to carry out an AND-operation between the modified pattern data formed by the step S19 and the first type exposure pattern data to form an overlap margin D24. The fourth process P21 is to combine the overlap margin D20 to the second type exposure pattern data D4 are free of any overlap margin, thereby a second type exposure pattern data D25 with the overlap margin.

The first process P11 is the same as in the first embodiment.

In the second process P19, the size or the width of the second type exposure pattern data D4 is increased by ΔW which is more than zero. The second type exposure pattern data D4 adjacent to the first type exposure pattern data D2 have overlap margins with the pattern data D2.

In the process P20, an AND-operation is made between the pattern data prepared by the process P19 and the first type exposure pattern data D2 to extract an overlap margin D24.

In the final process P21, an OR-operation is made between the second type exposure pattern data D4 and the overlap margin D24.

In accordance with this novel method, the second type exposure pattern data D4 is size-increased and then the AND-operation is made between the modified data D4 and the first type exposure pattern data D2 to form an overlap margin. The number of the necessary processes for obtaining the second type exposure pattern data with the overlap margins is smaller than in the first and second embodiments.

The second type exposure pattern data D4 have the overlap margin parallel to the boundary line without overlap margin parallel to the boundary line. If the second type exposure pattern is displaced in the vertical direction to the boundary line, then the size of the pattern is changed. In some cases, this pattern size change is not problem.

If the exposure pattern is the electrically conductive pattern, then it is preferable that ΔW is larger than L which is the short side length of the second type exposure pattern data.

Figure 21A:
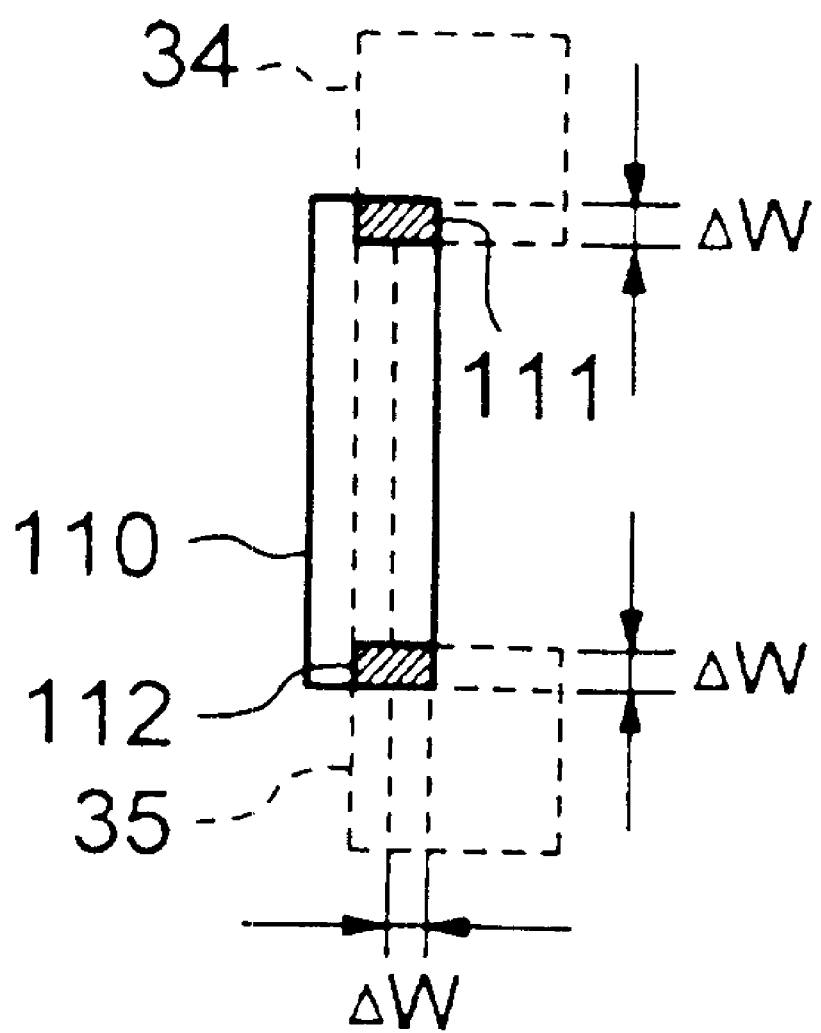
FIGS. 21A and 21B are views of electron beam exposure pattern portions in the sequential processes in FIG. 20.
Figure 21B:
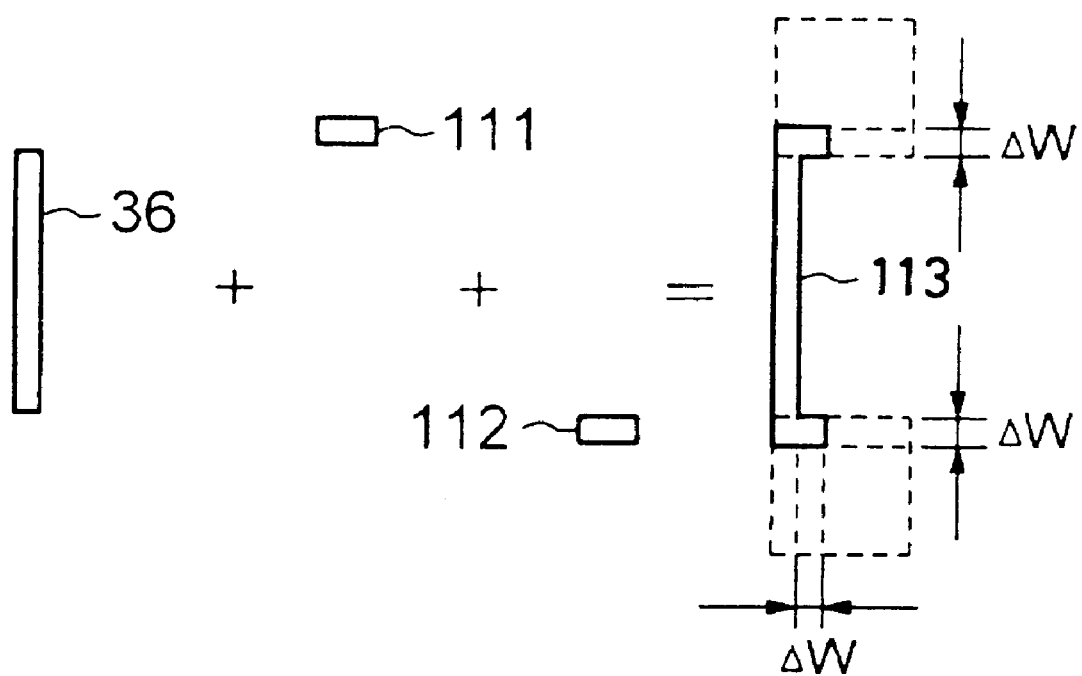

The novel method of this third embodiment is applied to the design pattern of FIG. 13. FIGS. 21A and 21B are views of electron beam exposure pattern portions in the sequential processes in FIG. 20. The process P11 is the same as described in the foregoing embodiment. The processes P19 to P21 will be described.

With reference to FIG. 21A, in the process P19, the electron beam exposure pattern 36 free of any overlap margin is size-increased by ΔW to form a pattern 110 which has overlap margins with the light beam exposure patterns 34 and 35.

In the process P20, an AND-operation is made between the pattern 110 and the light beam exposure patterns 34 and 35 to obtain overlap margins 111 and 122 which avoid disconnection unless a relative displacement in parallel to the boundary line is more than L+ΔW and unless a relative displacement in vertical to the boundary line is more than ΔW.

With reference to FIG. 21B, in the process P21, an OR-operation is made between the electron beam exposure pattern 36 free of the overlap margin and the overlap margins 111 and 112 to obtain an electron bean exposure pattern 113 having overlap margins.

Figure 22:
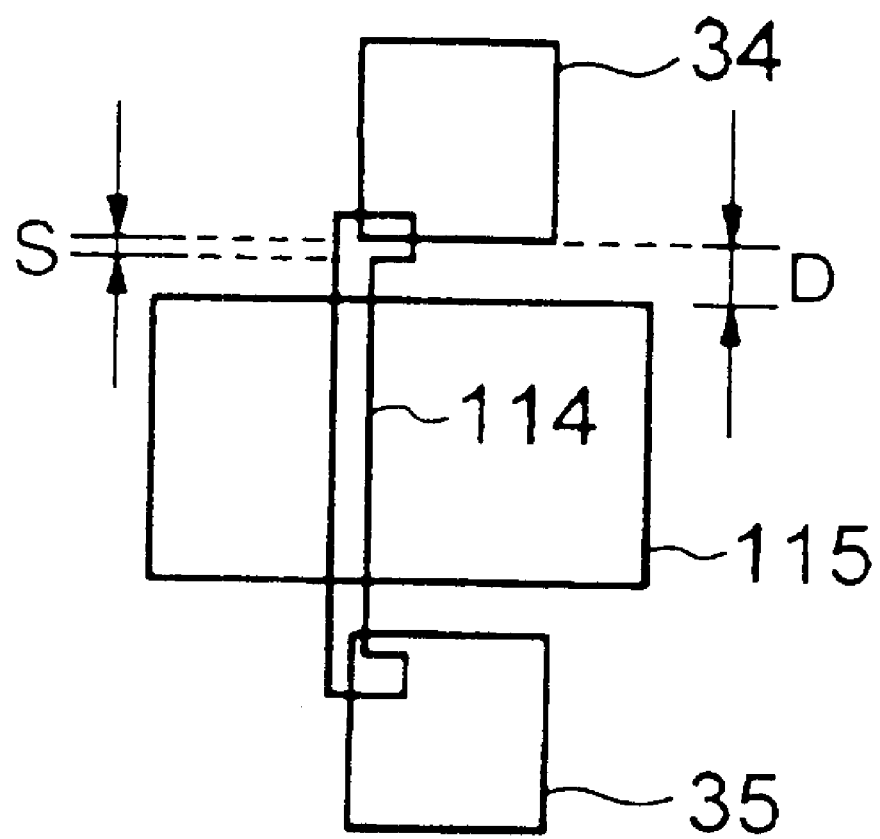
FIG. 22 is a view of an electron beam exposure pattern with overlap margins with light beam exposure patterns, according to at least one embodiment of the present invention.

FIG. 22 is a view of an electron beam exposure pattern with overlap margins with light beam exposure patterns, wherein even the electron beam exposure pattern is displaced relative to the light beam exposure patterns, the overlap margins connect between them. The electron beam exposure pattern 114 have overlap margins with light beam exposure patterns 34 and 35, wherein even the electron beam exposure pattern 114 is displaced by "S" relative to the light beam exposure patterns 34 and 35, then the electron beam exposure pattern 114 is connected to the light beam exposure patterns 34 and 35 through the overlap margins. However, the pattern shape is charged by the relative displacement. If a distance "D" between the light beam exposure patterns 34 and 35 from a field 115 is larger than the relative displacement "S", the pattern shape change is not problem. The device performance depends on the electron beam exposure pattern 114 over the field 115. The shape of the electron beam exposure pattern 114 over the field 115 is unchanged. For this reason, no problem is caused.

Although the invention has been described above in connection with several preferred embodiments therefor, it will be appreciated that those embodiments have been provided solely for illustrating the invention, and not in a limiting sense. Numerous modifications and substitutions of equivalent materials and techniques will be readily apparent to those skilled in the art after reading the present application, and all such modifications and substitutions are expressly understood to fall within the true scope and spirit of the appended claims.

What is claimed is:

1. A method of preparing a pattern data for a first type exposure process with a first resolving power and a second type exposure process with a second resolving power, which is higher than said first resolving power, said method comprising the steps of:

dividing said pattern data into a first type pattern data for said first type exposure process and a second type pattern data for said second type exposure process, wherein said second type pattern data is free of overlap margin;

carrying out at least a relative displacement of said second type pattern data to said first type pattern data and carrying out an AND-operation between said first and second type pattern data for forming an overlap margin between said first and second type pattern data; and combining said at least overlap margin with said second type pattern data.

2. The method as claimed in claim 1, wherein said combining step comprises an OR-operation between said at least overlap margin and said second type pattern data.

3. The method as claimed in claim 1, wherein said at least relative displacement is carried out in at least one of a first direction, a second direction anti-parallel to said first direction, a third direction perpendicular to said first direction and a fourth direction anti-parallel to said third direction.

4. The method as claimed in claim 3, wherein said first and second directions are perpendicular to a boundary line between said first and second type pattern data, and said third and fourth directions are parallel to said boundary line.

5. The method as claimed in claim 4, wherein said step of forming at least an overlap margin further comprises:

forming a first type overlap margin which extends from said boundary line in a perpendicular direction to said boundary line; and forming a second type overlap margin which extends in a direction parallel to said boundary line.

6. The method as claimed in claim 5, wherein said step of forming said second type overlap margin further comprises:

shifting said first type overlap margin in one of said first and second directions;

broadening an outline of said first type overlap margin for forming an additional overlap margin between said broadened first type overlap margin and said first type exposure pattern data; and shifting said additional overlap margin in one of said third and fourth directions for forming said second type overlap margin.

7. The method as claimed in claim 1, wherein said first type exposure process comprises a light beam exposure process, and said second type exposure process comprises an electron beam exposure process.

8. A method of preparing a pattern data for a first type exposure process with a first resolving power and a second type exposure process with a second resolving power, which is higher than said first resolving power, said method comprising the steps of:

dividing said pattern data into a first type pattern data for said first type exposure process and a second type pattern data for said second type exposure process, wherein said second type pattern data is free of overlap margin;

broadening an outline of said second type pattern data and carrying out an AND-operation between said first and second type pattern data for forming at least an overlap margin between said first and second type pattern data; and combining said at least overlap margin with said second type pattern data.

9. The method as claimed in claim 8, wherein said combining step comprises an OR-operation between said at least overlap margin and said second type pattern data.

10. The method as claimed in claim 8, wherein said step of broadening said outline is carried out in at least one pair of first and second directions anti-parallel to each other, and third and fourth directions anti-parallel to each other and perpendicular to said first and second directions.

11. The method as claimed in claim 10, wherein said first and second directions are perpendicular to a boundary line between said first and second type pattern data, and said third and fourth directions are parallel to said boundary line.

12. The method as claimed in claim 11, wherein said step of forming at least an overlap margin further comprises:

forming a first type overlap margin which extends from said boundary line in a perpendicular direction to said boundary line; and forming a second type overlap margin which extends in a direction parallel to said boundary line.

13. The method as claimed in claim 12, wherein said step of forming said second type overlap margin further comprises:

shifting said first type overlap margin in one of said first and second directions;

broadening an outline of said first type overlap margin for forming an additional overlap margin between said broadened first type overlap margin and said first type exposure pattern data; and shifting said additional overlap margin in one of said third and fourth directions for forming said second type overlap margin.

14. The method as claimed in claim 8, wherein said first type exposure process comprises a light beam exposure process, and said second type exposure process comprises an electron beam exposure process.

15. A method of preparing a pattern data for a first type exposure process with a first resolving power and a second type exposure process with a second resolving power, which is higher than said first resolving power, said method comprising the steps of:

dividing said pattern data into a first type pattern data for said first type exposure process and a second type pattern data for said second type exposure process, wherein said second type pattern data is free of overlap margin;

forming a first type overlap margin which extends from said boundary line in a perpendicular direction to said boundary line; and forming a second type overlap margin which extends in a direction parallel to said boundary line;

performing an AND-operation between said first and second type pattern data to extract said overlap margin; and combining said at least overlap margin with said second type pattern data.

16. The method as claimed in claim 15, wherein said step of forming said second type overlap margin further comprises:

shifting said first type overlap margin in one of said first and second directions;

broadening an outline of said first type overlap margin for forming an additional overlap margin between said broadened first type overlap margin and said first type exposure pattern data; and shifting said additional overlap margin in one of said third and fourth directions for forming said second type overlap margin.

17. The method as claimed in claim 15, wherein said combining step comprises an OR-operation between said at least overlap margin and said second type pattern data.

18. The method as claimed in claim 15, wherein said first type exposure process comprises a light beam exposure process, and said second type exposure process comprises an electron beam exposure process.

* * * * *